United States Patent
Kim et al.

(10) Patent No.: US 11,502,108 B2
(45) Date of Patent: Nov. 15, 2022

(54) DISPLAY DEVICE AND METHOD OF MANUFACTURING THE SAME

(71) Applicant: Samsung Display Co., LTD., Yongin-si (KR)

(72) Inventors: Kyongjun Kim, Hwaseong-si (KR); Sungsik Yun, Hwaseong-si (KR); Ju-Yeon Seo, Asan-si (KR); Sungho Cho, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 50 days.

(21) Appl. No.: 17/208,659

(22) Filed: Mar. 22, 2021

(65) Prior Publication Data

US 2021/0296366 A1  Sep. 23, 2021

(30) Foreign Application Priority Data

Mar. 23, 2020 (KR) ........................ 10-2020-0035049

(51) Int. Cl.
*G09F 9/30* (2006.01)
*H01L 27/12* (2006.01)

(52) U.S. Cl.
CPC .......... *H01L 27/1218* (2013.01); *G09F 9/301* (2013.01)

(58) Field of Classification Search
CPC ................... G09F 9/301; G06F 1/1652; G06F 2203/04102; H01L 27/1218; H01L 27/124; H01L 27/1248; H01L 27/3244; H01L 27/3246; H01L 27/3248; H01L 27/3258; H01L 27/3262; G02F 1/136227; G02F 1/136277; G02F 1/136281; G02F 1/13629; G02F 1/136295
See application file for complete search history.

(56) References Cited

U.S. PATENT DOCUMENTS

| | | | |
|---|---|---|---|
| 9,287,329 B1* | 3/2016 | Lee | H01L 27/124 |
| 9,740,035 B2* | 8/2017 | Kwon | H01L 27/124 |
| 9,758,872 B2* | 9/2017 | Lee | C23C 16/50 |
| 10,763,281 B2* | 9/2020 | Lee | H01L 27/3248 |
| 2007/0080356 A1* | 4/2007 | Nakayama | H01L 51/5228 257/E27.111 |
| 2016/0179229 A1* | 6/2016 | Ahn | G06F 3/0447 345/173 |
| 2017/0194411 A1* | 7/2017 | Park | H01L 27/3276 |
| 2018/0158894 A1* | 6/2018 | Park | H01L 51/5256 |
| 2018/0219179 A1* | 8/2018 | Son | H01L 27/1225 |
| 2019/0012031 A1 | 1/2019 | Kim et al. | |
| 2019/0067404 A1* | 2/2019 | Lee | H01L 51/5218 |
| 2020/0371549 A1* | 11/2020 | Park | G06F 1/1652 |
| 2020/0388784 A1* | 12/2020 | Kim | H01L 27/326 |

FOREIGN PATENT DOCUMENTS

| | | |
|---|---|---|
| KR | 10-2014-0103025 | 8/2014 |
| KR | 10-2020-0140439 | 12/2020 |

* cited by examiner

*Primary Examiner* — Joe H Cheng
(74) *Attorney, Agent, or Firm* — Kile Park Reed & Houtteman PLLC

(57) ABSTRACT

A display device includes a base substrate including a display area and a bending area bent from the display area, the bending area including a central area, and an edge area positioned at a side of the central area, a pixel structure disposed in the display area on the base substrate, an inorganic pattern disposed in the central area on the base substrate, and an organic pattern disposed on the inorganic pattern, overlapping the inorganic pattern, and contacting the base substrate in the edge area.

20 Claims, 20 Drawing Sheets

DISPLAY DEVICE AND METHOD OF MANUFACTURING THE SAME

CROSS-REFERENCE TO RELATED APPLICATION(S)

This application claims priority to and benefits of Korean Patent Application No. 10-2020-0035049 under 35 U.S.C. § 119, filed on Mar. 23, 2020, in the Korean Intellectual Property Office, the entire contents of which are incorporated herein by reference for all purposes as if fully set forth herein.

BACKGROUND

1. Technical Field

Embodiments relate generally to a display device. Embodiments relate to the display device including a bending area.

2. Description of the Related Art

Recently, a flat panel display device having advantages such as being less in weight and thinness has been used as a display device replacing a cathode ray tube display device. Examples of the flat panel display device may include a liquid crystal display device and an organic light emitting display device. By bending a bending area of a plastic substrate included in the organic light emitting display device, a dead space of the organic light emitting display device may be reduced. However, as the plastic substrate is bent, a stress may be applied to the plastic substrate in the bending area. Accordingly, cracks may be generated in the plastic substrate. The cracks may diffuse from the bending area of the plastic substrate to a display area of the plastic substrate, and thus a display quality of the organic light emitting display device may be deteriorated.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An embodiment provides a display device including a bending area.

An embodiment provides a method of manufacturing the display device.

A display device according to an embodiment may include a base substrate including a display area; and a bending area bent from the display area, the bending area may include a central area; and an edge area positioned at a side of the central area; a pixel structure disposed in the display area on the base substrate; an inorganic pattern disposed in the central area on the base substrate; and an organic pattern disposed on the inorganic pattern, overlapping the inorganic pattern, and contacting the base substrate in the edge area.

According to an embodiment, the inorganic pattern may not be disposed in the edge area of the base substrate.

According to an embodiment, the inorganic pattern may include a barrier layer disposed on the base substrate; and a buffer layer disposed on the barrier layer.

According to an embodiment, the organic pattern and a pixel defining layer may include a same material.

According to an embodiment, the organic pattern may be a bending protection layer.

According to an embodiment, the display device may further include a dummy metal pattern of an island shape disposed on the inorganic pattern.

According to an embodiment, the display device may further include an insulation pattern overlapping the dummy metal pattern; and at least one connection line disposed on the insulation pattern and overlapping the dummy metal pattern.

According to an embodiment, the at least one connection line may electrically connect the pixel structure to an external device.

According to an embodiment, the pixel structure may include an active pattern disposed on the inorganic pattern; a gate insulation layer overlapping the active pattern; a gate electrode disposed on the gate insulation layer and overlapping the active pattern; an interlayer insulation layer overlapping the gate electrode; a first metal pattern disposed on the interlayer insulation layer and electrically connected to the active pattern; a first via pattern overlapping the first metal pattern; a second metal pattern disposed on the first via pattern and electrically connected to the first metal pattern; a second via pattern overlapping the second metal pattern; a first electrode disposed on the second via pattern and electrically connected to the second metal pattern; an emission layer disposed on the first electrode; and a second electrode disposed on the emission layer. The at least one connection line and the second metal pattern may include a same material.

According to an embodiment, the dummy metal pattern and the first metal pattern may include a same material.

According to an embodiment, the insulation pattern and the first via pattern may include a same material.

According to an embodiment, the base substrate may include a first peripheral area positioned between the display area and the bending area and adjacent to a first side of the bending area; and a second peripheral area adjacent to a second side of the bending area, the second side of the bending area being opposite to the first side of the bending area. The display device may further include a plurality of inorganic pieces that may be disposed in the edge area on the base substrate and spaced apart from each other, and extend from the second peripheral area to the first peripheral area.

According to an embodiment, the display device may further include insulation pieces disposed on the plurality of inorganic pieces, respectively, and the organic pattern may overlap the insulation pieces.

According to an embodiment, the pixel structure may include an active pattern disposed on the inorganic pattern; a gate insulation layer overlapping the active pattern; a gate electrode disposed on the gate insulation layer and overlapping the active pattern; an interlayer insulation layer overlapping the gate electrode; a first metal pattern disposed on the interlayer insulation layer and electrically connected to the active pattern; a first via pattern overlapping the first metal pattern; a second metal pattern disposed on the first via pattern and electrically connected to the first metal pattern; a second via pattern overlapping the second metal pattern; a first electrode disposed on the second via pattern and electrically connected to the second metal pattern; an emission layer disposed on the first electrode; and a second electrode disposed on the emission layer. Each of the insulation pieces and the first via pattern may include a same material.

A method of manufacturing a display device according to an embodiment may include providing a base substrate including a display area and a bending area bent from the display area, the bending area including a central area and an edge area positioned at a side of the central area; forming an inorganic pattern layer on the base substrate; forming an insulation pattern on the inorganic pattern layer in the central area; and forming an inorganic pattern by removing the inorganic pattern layer overlapping the edge area through an etching process using the insulation pattern as a mask.

According to an embodiment, the forming of the inorganic pattern may include forming the inorganic pattern to overlap the insulation pattern.

According to an embodiment, the method may further include forming an organic pattern on the base substrate after the forming of the inorganic pattern to contact the base substrate in the edge area.

According to an embodiment, the method may further include forming a dummy metal pattern of an island shape on the inorganic pattern layer in the central area.

According to an embodiment, the method may further include forming a pixel structure in the display area on the base substrate. The forming of the pixel structure may include forming an active pattern on the inorganic pattern; forming a gate insulation layer overlapping the active pattern; forming a gate electrode on the gate insulation layer and overlapping the active pattern; forming an interlayer insulation layer overlapping the gate electrode; forming a first metal pattern on the interlayer insulation layer and electrically connected to the active pattern; forming a first via pattern overlapping the first metal pattern; forming a second metal pattern on the first via pattern and electrically connected to the first metal pattern; forming a second via pattern overlapping the second metal pattern; forming a first electrode on the second via pattern and electrically connected to the second metal pattern; forming an emission layer on the first electrode; and forming a second electrode on the emission layer. The forming of the insulation pattern may include forming the insulation pattern together with the first via pattern.

According to an embodiment, the forming of the dummy metal pattern may include forming the dummy metal pattern together with the first metal pattern.

Therefore, the display device according to embodiments may include first and second edge areas in which an inorganic pattern may not be disposed. Accordingly, a stress applied to the first and second edge areas may be reduced. Therefore, cracks may not be generated in a base substrate overlapping the first and second edge areas. For example, an insulation pattern, which may be disposed on the inorganic pattern, may be used as mask to form the inorganic pattern. Accordingly, the number of masks required for a manufacturing process of the display device may be reduced.

It is to be understood that both the foregoing general description and the following detailed description are by way of example and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure, and together with the description serve to explain the disclosure in which.

DETAILED DESCRIPTION OF THE EMBODIMENTS

Figure 1:
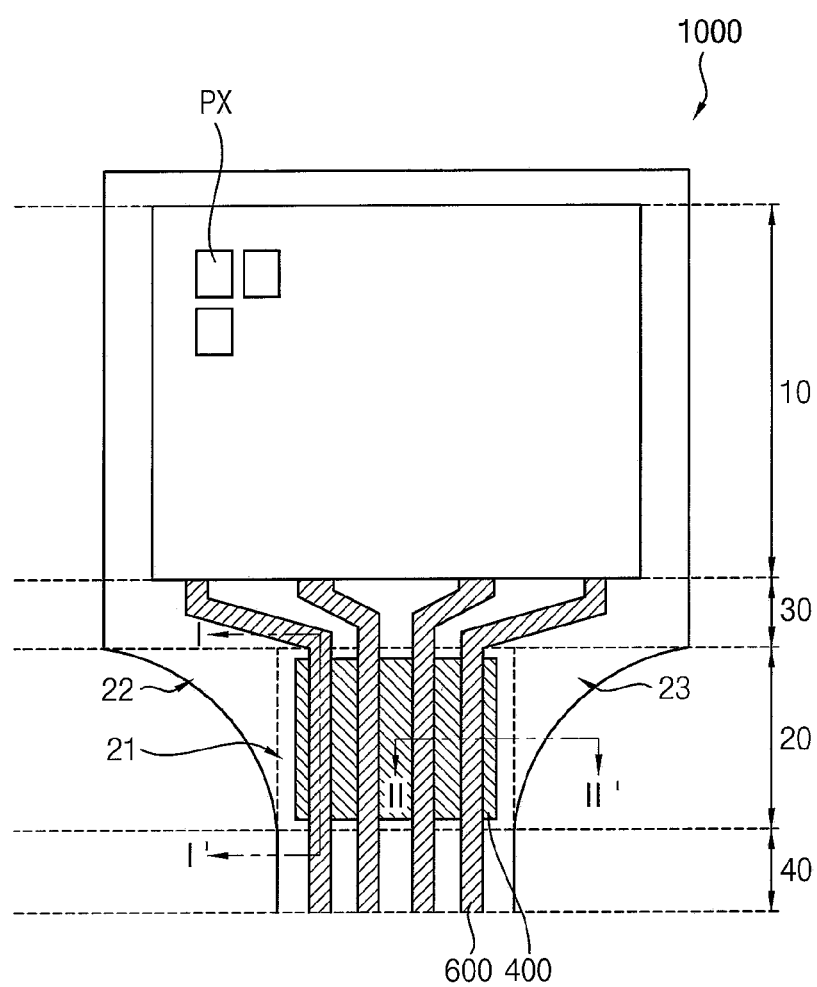
FIG. 1 is a plan view illustrating a display device according to an embodiment.

Illustrative, non-limiting embodiments will be more clearly understood from the following detailed description in conjunction with the accompanying drawings.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

As used herein, the singular forms "a," "an," and "the" are intended to include the plural forms as well, unless the context clearly indicates otherwise.

It will be further understood that the terms "comprises" and/or "comprising" "includes" and/or "including" and "have" and/or "having" and their variations thereof as used herein specify the presence of stated features or elements, but do not preclude the presence or addition of one or more other features or elements.

It will be understood that when an element such as a layer, film, region, or substrate is referred to as being "on" another element, it may be directly on the other element or one or more intervening elements may also be present.

Although the terms first, second, and the like are used to describe various components, it is to be understood that these components are not limited by these terms. These terms are only used to distinguish one component from another component. Therefore, it is to be understood that the first component mentioned below may be the second component within the spirit and the scope of the disclosure.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected and/or may be indirectly electrically connected with intervening layers, regions, or elements therebetween.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Figure 2:
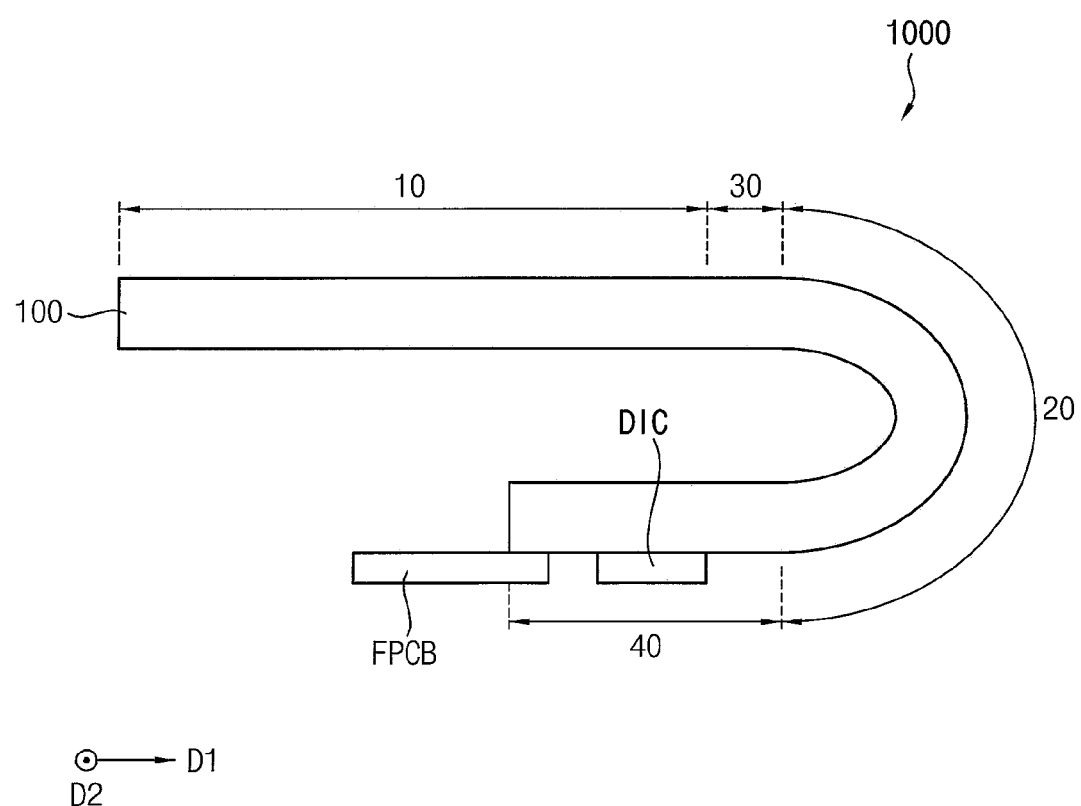
FIG. 2 is a schematic cross-sectional view illustrating a bent shape of the display device of FIG. 1.

FIG. 1 is a plan view illustrating a display device according to an embodiment. FIG. 2 is a schematic cross-sectional view illustrating a bent shape of the display device of FIG. 1.

Referring to FIGS. 1 and 2, the display device 1000 according to an embodiment may include a display area 10, a bending area 20, a first peripheral area 30, and a second peripheral area 40. For example, the bending area 20 may be spaced apart from the display area 10 in a first direction D1. The first peripheral area 30 may be positioned between the display area 10 and the bending area 20. For example, the first peripheral area 30 may be adjacent to a first side of the bending area 20 in the first direction D1. The second peripheral area 40 may be adjacent to a second side opposite to the first side of the bending area 20.

At least one pixel structure PX may be disposed in the display area 10. The pixel structure PX may emit light by receiving signals and voltages from an external device. An image may be displayed in the display area 10 through the pixel structure PX. For example, lines or wires may be disposed in the display area 10. The wires may transmit the signals and the voltages to the pixel structure PX. For example, the lines may include a data line, a scan line, an emission management line, and a power line.

The first peripheral area 30 may extend from the display area 10 in a first direction D1. For example, a width of the first peripheral area 30 extending in the second direction D2 perpendicular to the first direction D1 may be as same as a width extending in the second direction D2 of the display area 10.

In an embodiment, at least one connection line 600 extending in the first direction D1 may be disposed in the first peripheral area 30. The connection line 600 may electrically connect the external device disposed in the second peripheral area 40 and the pixel structure PX. For example, the connection line 600 may transmit the signal or the voltage to the lines.

The bending area 20 may be bent from the first peripheral area 30 along the second direction D2. As the bending area 20 is bent, a dead space of the display device 1000 may be reduced.

In an embodiment, the bending area 20 may include a central area 21, a first edge area 22, and a second edge area 23. The central area 21, the first edge area 22, and the second edge area 23 may be bent along the second direction D2.

For example, the central area 21 may have a constant width in the second direction D2. An inorganic pattern (for example, an inorganic pattern 200 in FIG. 3), a dummy metal pattern 400, and the connection line 600 may be disposed in the central area 21. For example, the dummy metal pattern 400 may have an island or isolated shape. In other words, any signal and any voltage may not be provided to the dummy metal pattern 400. The dummy metal pattern 400 may prevent a spread of cracks generated in the base substrate 100 of the bending area 20.

The first edge area 22 may be positioned at one or a side of the central area 21 in the second direction D2. The second edge area 23 may be positioned at the other or another side opposite to the one or a side of the central area 21. In detail, in order to reduce the dead space of the display device 1000, a width of the second peripheral area 40 in which the external device may be disposed may be smaller than a width of the first peripheral area 30 adjacent to the display area 10. In a process of forming the base substrate 100 including the first peripheral area 30 and the second peripheral area 40 having different widths, the first and second edge areas 22 and 23 may be formed. For example, a width of each of the first and second edge areas 22 and 23 extending in the second direction D2 may decrease toward the first direction D1.

Figure 4:
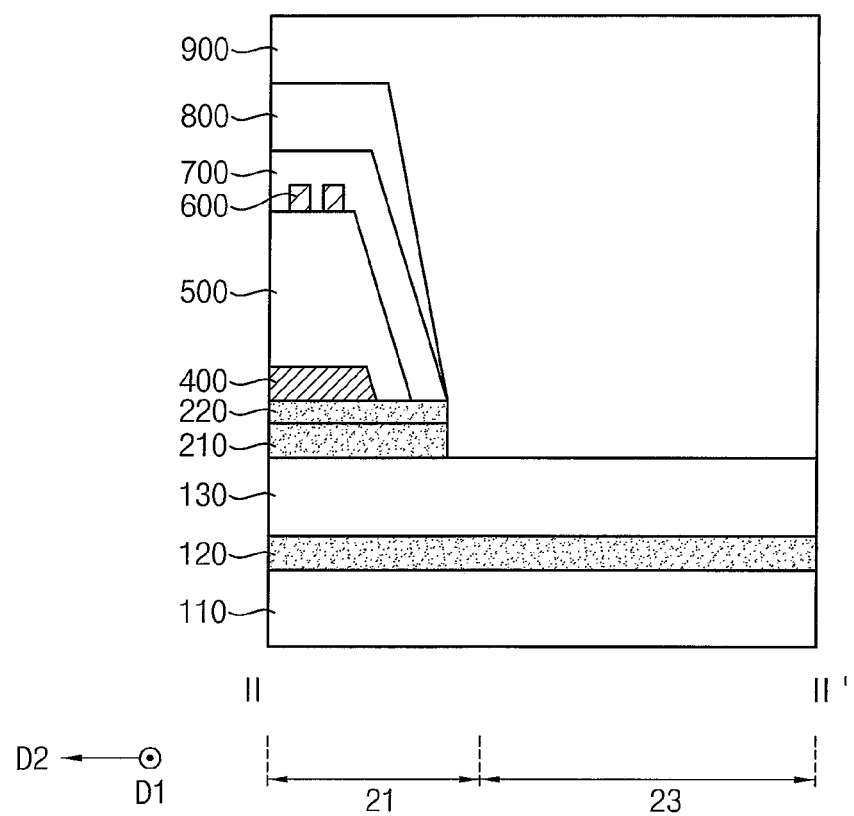
FIG. 4 is a schematic cross-sectional view corresponding to a central area and an edge area of the display device of FIG. 1.

An organic pattern (for example, a first organic pattern 800 or a second organic pattern 900 in FIG. 4) may be disposed in each of the first and second edge areas 22 and 23. For example, the organic pattern may contact or may be disposed on the base substrate 100 in each of the first and second edge areas 22 and 23. In other words, the inorganic pattern may not be disposed in each of the first and second edge areas 22 and 23.

As described above, the central area 21, the first edge area 22, and the second edge area 23 may be bent along the second direction D2. Accordingly, a stress may be applied to the central area 21, the first edge area 22, and the second edge area 23.

The second peripheral area 40 may extend in the first direction D1 from the bending area 20. In an embodiment, the connection line 600 extending in the first direction D1 may be disposed in the second peripheral area 40. For example, the external device may be disposed in the second peripheral area 40. The external device may generate the signal and the voltage provided to the pixel structure PX. For example, the external device may be a driving integrated circuit DIC that may generate the data voltage. In this case, the connection line 600 may transmit the data voltage to the lines. For example, a flexible printed circuit board FPCB may be disposed in the second peripheral area 40. In this case, the external device may be disposed on the base substrate 100 of the second peripheral area 40 or mounted on the flexible printed circuit board FPCB.

Figure 3:
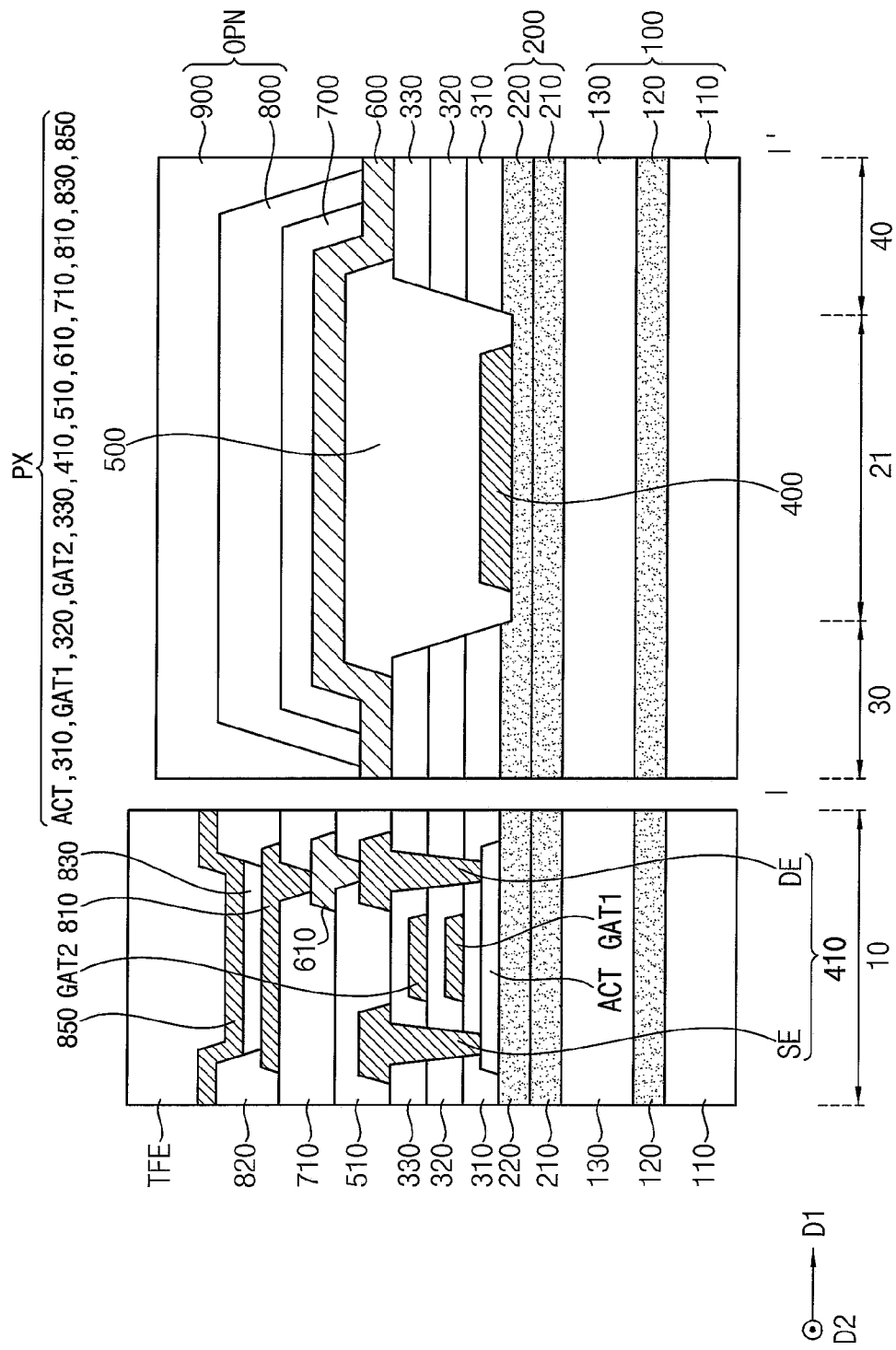
FIG. 3 is a schematic cross-sectional view corresponding to a display area, a central area, a first peripheral area, and a second peripheral area of the display device of FIG. 1.
Figure 5:
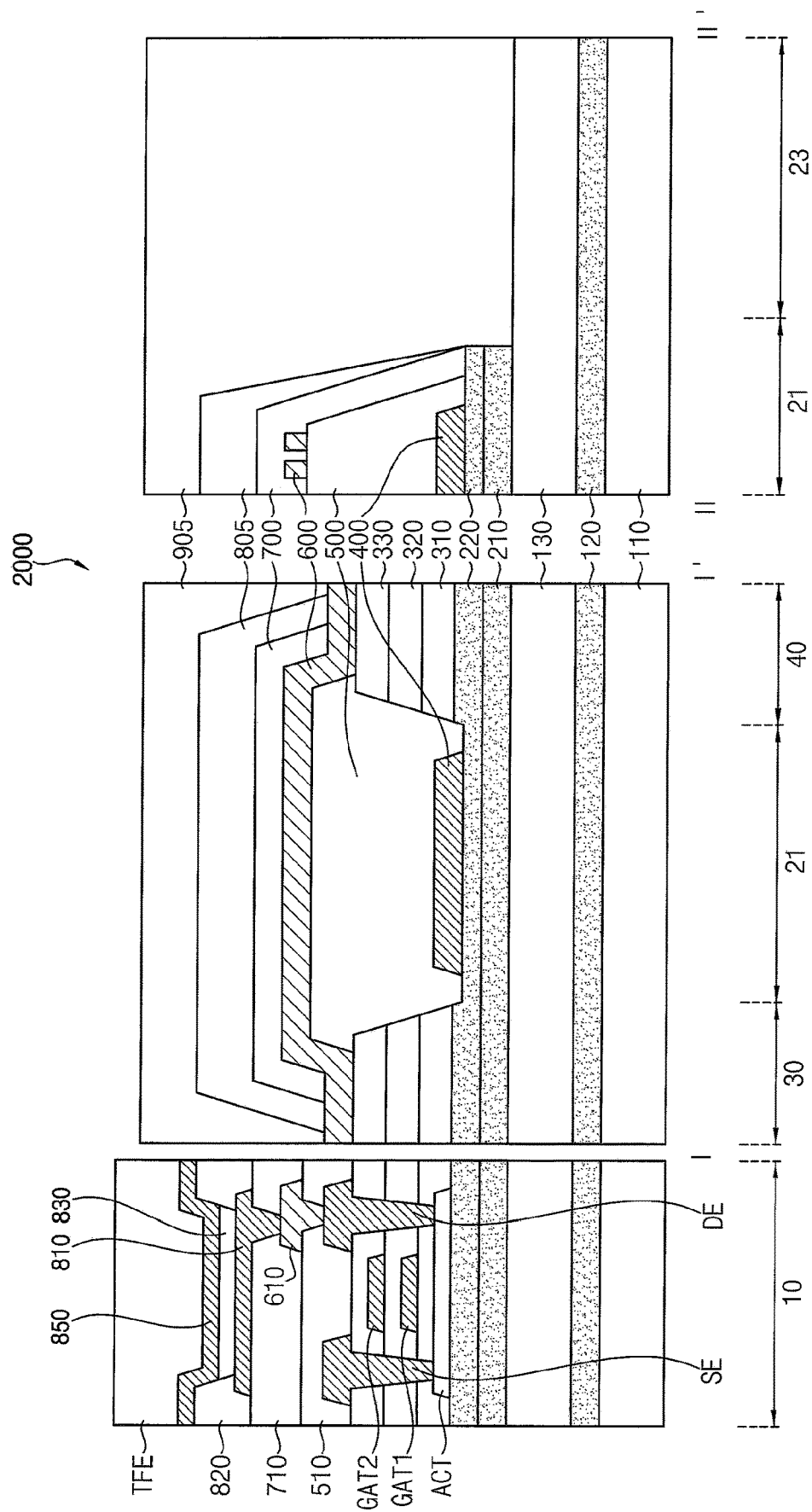
FIG. 5 is a schematic cross-sectional view illustrating a display device according to an embodiment.

FIG. 3 is a schematic cross-sectional view corresponding to a display area, a central area, a first peripheral area, and a second peripheral area of the display device of FIG. 1. FIG. 4 is a schematic cross-sectional view corresponding to a central area and an edge area of the display device of FIG. 1. FIG. 5 is a schematic cross-sectional view illustrating a display device according to an embodiment. For example, FIG. 3 may be a schematic cross-sectional view taken along line I-I' of FIG. 1 and FIG. 4 may be a schematic cross-sectional view taken along line II-II' of FIG. 1.

Referring to FIG. 3, the display device 1000 may include the base substrate 100, the inorganic pattern 200, the pixel structure PX, the dummy metal pattern 400, the first insulation pattern 500, the connection line 600, a second insulation pattern 700, an organic pattern OPN, and a thin film encapsulation layer TFE. The base substrate 100 may include a first plastic substrate 110, a first barrier layer 120 and a second plastic substrate 130. The inorganic pattern 200 may include a second barrier layer 210 and a buffer layer 220. The pixel structure PX may include an active pattern ACT, a first gate insulation layer 310, a first gate electrode GAT1, a second gate insulation layer 320, a second gate electrode GAT2, and an interlayer insulation layer 330, a first metal pattern 410, a first via pattern 510, a second metal pattern 610, a second via pattern 710, a first electrode 810, a pixel defining layer 820, an emission layer 830, and a second electrode 850. The organic pattern OPN may include a first organic pattern 800 and a second organic pattern 900.

The first plastic substrate 110 may include a transparent or opaque material. In order for the first plastic substrate 110 to be bent in the bending area 20, the first plastic substrate 110 may have flexibility. For example, the first plastic substrate 110 may be polyimide ("PI"), polyethylene naphthalate ("PEN"), polyethylene terephthalate ("PET"), polyarylate ("PAR"), polycarbonate ("PC"), polyether imide ("PEI"), polyether sulfone ("PES"), and the like within the spirit and the scope of the disclosure.

The first barrier layer 120 may be disposed on the first plastic substrate 110. For example, the first barrier layer 120 may include silicon oxide ("SiOx"), silicon nitride ("SiNx"), or the like within the spirit and the scope of the disclosure.

The second plastic substrate 130 may be disposed on the first barrier layer 120. The second plastic substrate 130 may include a same or similar material as the first plastic substrate 110. The base substrate 100 may have a structure in which the first plastic substrate 110, the first barrier layer 120, and the second plastic substrate 130 may be sequentially stacked. Accordingly, a moisture permeability of the base substrate 100 may be reduced, and a diffusion of foreign materials into the pixel structure PX may be prevented.

In an embodiment, a protection film may be disposed on a lower surface of the base substrate 100. For example, the protection film may be disposed in the display area 10, the first peripheral area 30, and the second peripheral area 40. Accordingly, the protection film may expose the lower surface of the base substrate 100 overlapping the bending area 20. The protection film may support the base substrate 100 and may protect the base substrate 100 from external impact. For example, the protection film may include polyethylene terephthalate ("PET"), polyethylene naphthalene ("PEN"), polypropylene ("PP"), polycarbonate ("PC"), polystyrene ("PS"), polyethersulfone ("PES"), polyarylate ("PAR"), and so on, by way of non-limiting example.

The second barrier layer 210 may be disposed on the second plastic substrate 130. In an embodiment, the second barrier layer 210 may be disposed on the second plastic substrate 130 in the display area 10, the central area 21, the first peripheral area 30, and the second peripheral area 40. The second barrier layer 210 may include a same or similar material as the first barrier layer 120.

The buffer layer 220 may be disposed on the second barrier layer 210. In an embodiment, the buffer layer 220 may be disposed on the second barrier layer 210 in the display area 10, the central area 21, the first peripheral area 30, and the second peripheral area 40. The buffer layer 220 may prevent diffusion of metal atoms or impurities from the base substrate 100 to the active pattern ACT. For example, the buffer layer 220 may control a heat transfer rate during a crystallization process for forming the active pattern ACT.

For example, a thickness of the inorganic pattern 200 may be about 7000 angstroms.

The inorganic pattern 200 may include an inorganic material such as silicon oxide ("SiOx") and silicon nitride ("SiNx"). A ductility of inorganic materials is lower than a ductility of organic materials or metallic materials. Accordingly, in a case that the inorganic pattern 200 is bent, a stress may be concentrated in the inorganic pattern 200, and a crack may be generated in the inorganic pattern 200.

The active pattern ACT may be disposed on the buffer layer 220 in the display area 10. The active pattern ACT may include a source area and a drain area doped with impurities, and a channel area between the source area and the drain area. For example, the active pattern ACT may include an oxide semiconductor, amorphous silicon, polycrystalline silicon, or the like within the spirit and the scope of the disclosure.

The first gate insulation layer 310 may be disposed on the buffer layer 220 and may cover or overlap the active pattern ACT. For example, the first gate insulation layer 310 may have a substantially flat top surface without generating a step around the active pattern ACT. Alternatively, the first gate insulation layer 310 may be disposed to have a uniform thickness along a profile of the active pattern ACT. In an embodiment, an opening exposing an upper surface of the buffer layer 220 overlapping the central area 21 may be formed in the first gate insulation layer 310.

The first gate electrode GAT1 may be disposed on the first gate insulation layer 310 and may overlap the channel area of the active pattern ACT. For example, the first gate electrode GAT1 may be formed in a single layer structure or a multilayer structure including a metal film, an alloy film, a metal nitride film, a conductive metal oxide film, and/or a transparent conductive material film. For example, the first gate electrode GAT1 may include silver ("Ag"), an alloy containing silver, molybdenum ("Mo"), an alloy containing molybdenum, aluminum ("Al"), an alloy containing aluminum, Aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like within the spirit and the scope of the disclosure.

The second gate insulation layer 320 may be disposed on the first gate insulation layer 310, and may cover or overlap the first gate electrode GAT1. For example, the second gate insulation layer 320 may have a substantially flat top surface without generating a step around the first gate electrode GAT1. Alternatively, the second gate insulation layer 320 may be disposed to have a uniform thickness along a profile of the first gate electrode GAT1. In an embodiment, an opening exposing an upper surface of the buffer layer 220 overlapping the central area 21 may be formed in the second gate insulation layer 320.

The second gate electrode GAT2 may be disposed on the second gate insulation layer 320 and may overlap the first gate electrode GAT1. For example, the second gate electrode GAT2 may include a same or similar material as the first gate electrode GAT1.

The interlayer insulation layer 330 may be disposed on the second gate insulation layer 320 and may cover or overlap the second gate electrode GAT2. For example, the interlayer insulation layer 330 may have a substantially flat top surface without generating a step difference around the second gate electrode GAT2. Alternatively, the interlayer insulation layer 330 may be disposed to have a uniform thickness along a profile of the second gate electrode GAT2. In an embodiment, an opening exposing an upper surface of the buffer layer 220 overlapping the central area 21 may be formed in the interlayer insulation layer 330.

The first metal pattern 410 may be disposed on the interlayer insulation layer 330. For example, the first metal pattern 410 may include a source electrode SE and a drain electrode DE. The source electrode SE may electrically contact the source area of the active pattern ACT through a first contact hole formed in the first gate insulation layer 310, the second gate insulation layer 320, and the interlayer insulation layer 330. The drain electrode DE may electrically contact the drain area of the active pattern ACT through a second contact hole formed in the first gate insulation layer 310, the second gate insulation layer 320, and the interlayer insulation layer 330. For example, the source electrode SE and the drain electrode DE may include a metal film, an alloy film, a metal nitride film, a conductive metal oxide film and/or a transparent conductive material film, and may have a single layer structure or a multilayer structure.

The first via pattern 510 may be disposed on the interlayer insulation layer 330 and may cover or overlap the first metal pattern 410. For example, the first via pattern 510 may have a substantially flat top surface without generating a step around the first metal pattern 410. In an embodiment, the first via pattern 510 may include an organic material. For example, the first via pattern 510 may include a photoresist, a polyacrylic resin, a polyimide resin, an acrylic resin, or the like within the spirit and the scope of the disclosure.

The second metal pattern 610 may be disposed on the first via pattern 510. For example, the second metal pattern 610 may electrically contact the drain electrode DE through a contact hole formed in the first via pattern 510. Accordingly, the second metal pattern 610 may electrically connect the drain electrode DE and the first electrode 810. For example, the second metal pattern 610 may include a same or similar material as the first metal pattern 410.

The second via pattern 710 may be disposed on the first via pattern 510 and may cover or overlap the second metal pattern 610. For example, the second via pattern 710 may have a substantially flat top surface without generating a step around the second metal pattern 610. For example, the second via pattern 710 may include an organic material.

The first electrode 810 may be disposed on the second via pattern 710. The first electrode 810 may electrically contact the second metal pattern 610 through a contact hole formed in the second via pattern 710. The first electrode 810 may have a reflective property or a translucent property. For example, the first electrode 810 may include aluminum ("Al"), an alloy containing aluminum, aluminum nitride ("AlN"), silver ("Ag"), an alloy containing silver, magnesium ("Mg"), an alloy containing magnesium, and tungsten ("W"), tungsten nitride ("WN"), copper ("Cu"), an alloy containing copper, nickel ("Ni"), chromium ("Cr"), chromium nitride ("CrN"), molybdenum ("Mo"), an alloy containing molybdenum, titanium ("Ti"), titanium nitride ("TiN"), platinum ("Pt"), tantalum ("Ta"), tantalum nitride ("TaN"), neodymium ("Nd"), scandium ("Sc"), indium tin oxide ("ITO"), indium zinc oxide ("IZO"), and the like within the spirit and the scope of the disclosure.

The pixel defining layer 820 may be disposed on the second via pattern 710. An opening exposing an upper surface of the first electrode 810 may be formed in the pixel defining layer 820. An emission area and a non-emission area of the display area 10 may be formed by the opening formed in the pixel defining layer 820. For example, an area overlapping the opening may be the emission area of the display area 10, and an area where the pixel defining layer 820 remains may be the non-emission area of the display area 10. For example, the pixel defining layer 820 may include an organic material such as a photoresist, a polyacrylic resin, a polyimide resin, or an acrylic resin.

The emission layer 830 may be disposed on the first electrode 810 exposed through the opening of the pixel defining layer 820. For example, the emission layer 830 may have a multilayer structure including a hole injection layer, a hole transport layer, an organic emission layer, an electron transport layer, and an electron injection layer. The organic emission layer may include a light-emitting material that may emit light having a certain or predetermined color.

The second electrode 850 may be disposed on the emission layer 830 and the pixel defining layer 820. For example, the second electrode 850 may have a substantially plate shape. For example, the second electrode 850 may have a translucent property or a reflective property. For example, the second electrode 850 may include aluminum ("Al"), an alloy containing aluminum, aluminum nitride ("AlN"), silver ("Ag"), an alloy containing silver, magnesium ("Mg"), an alloy containing magnesium, and tungsten ("W"), tungsten nitride ("WN"), copper ("Cu"), an alloy containing copper, nickel ("Ni"), chromium ("Cr"), chromium nitride ("CrN"), molybdenum ("Mo"), an alloy containing molybdenum, titanium ("Ti"), titanium nitride ("TiN"), platinum ("Pt"), tantalum ("Ta"), tantalum nitride ("TaN"), neodymium ("Nd"), scandium ("Sc"), indium tin oxide ("ITO"), indium zinc oxide ("IZO"), and the like within the spirit and the scope of the disclosure.

The thin film encapsulation layer TFE may prevent moisture and oxygen from penetrating into the pixel structure PX. For example, the thin film encapsulation layer TFE may have a structure in which a first inorganic layer, an organic layer, and a second inorganic layer may be sequentially stacked.

The dummy metal pattern 400 may be disposed in the central area 21 on the inorganic pattern 200. As described above, the dummy metal pattern 400 may have an island or isolated shape. In other words, any signal and any voltage may not be provided to the dummy metal pattern 400. In an embodiment, the dummy metal pattern 400 may include a same or similar material as the first metal pattern 410. For example, the dummy metal pattern 400 may be formed together with the first metal pattern 410. Accordingly, the dummy metal pattern 400 may prevent cracks, which may be generated in the base substrate 100 and/or the inorganic pattern 200 in the bending area, from spreading to the display area 10, the first peripheral area 30, and the second peripheral area 40. In an embodiment, the dummy metal pattern 400 may be formed together with the first gate electrode GAT1. In an embodiment, the dummy metal pattern 400 may be formed together with the second gate electrode GAT2.

The first insulation pattern 500 may be disposed in the central area 21 on the inorganic pattern 200. The first insulation pattern 500 may cover or overlap the dummy metal pattern 400. For example, the first insulation pattern 500 may fill the opening exposing an upper surface of the inorganic pattern 200. In an embodiment, the first insulation pattern 500 may include a same or similar material as the first via pattern 510. For example, an upper surface of the first insulation pattern 500 may have a same height as an upper surface of the first via pattern 510. For example, the first insulation pattern 500 may be formed together with the first via pattern 510.

The connection line 600 may be disposed on the first insulation pattern 500. Accordingly, the connection line 600 may overlap the dummy metal pattern 400. As described above, the connection line 600 may electrically connect the external device disposed in the second peripheral area 40 to the pixel structure PX.

The second insulation pattern 700 may be disposed in the central area 21 on the first insulation pattern 500. The second insulation pattern 700 may cover or overlap the connection line 600. In an embodiment, the second insulation pattern 700 may include a same or similar material as the second via pattern 710. For example, the second insulation pattern 700 may be formed together with the second via pattern 710.

The first organic pattern 800 may be disposed on the second insulation pattern 700 and may cover or overlap the second insulation pattern 700. In an embodiment, the first organic pattern 800 may include a same or similar material as the pixel defining layer 820. For example, the first organic pattern 800 may be formed together with the pixel defining layer 820.

The second organic pattern 900 may be disposed on the first organic pattern 800 and may cover or overlap the first organic pattern 800. In an embodiment, the second organic pattern 900 may be a bending protection layer. The second organic pattern 900 may protect the connection line 600. For example, the second organic pattern 900 may adjust a position of a neutral surface of the bending area 20. For example, the second organic pattern 900 may be adjusted to position the neutral surface in a vicinity of the connection line 600. Accordingly, a stress applied to the connection line 600 may be minimized. For example, the second organic pattern 900 may include an organic material such as polyimide, epoxy resin, acrylic resin, polyester, a photoresist, polyacrylic resin, polyimide resin, polyamide resin, by way of non-limiting example within the spirit and the scope of the disclosure.

Referring to FIG. 4, a first organic pattern 800 and a second organic pattern 900 may be disposed in the second edge area 23 on the base substrate 100. In detail, the base substrate 100 and the first organic pattern 800 may contact each other in the second edge area 23. In other words, the inorganic pattern 200 may not be disposed in the second edge area 23 on the base substrate 100.

A related art display device may include an inorganic pattern disposed in the bending area. Accordingly, a stress applied to the second edge area may be greater than a stress applied to the central area. Cracks may be generated in the base substrate in the second edge area due to the stress applied to the second edge area. Since the cracks may diffuse into the base substrate in the display area, the central area, the first peripheral area, and the second peripheral area, a display quality of the related art display device may be deteriorated.

On the other hand, the display device 1000 according to an embodiment may include the second edge area 23 on which the inorganic pattern 200 may not be disposed. Accordingly, a stress applied to the second edge area 23 may be reduced, and cracks may not be generated in the base substrate 100 in the second edge area 23. Accordingly, the display quality of the display device 1000 may be improved.

Referring to FIG. 5, a display device 2000 according to an embodiment may be substantially the same as the display device 1000 described with reference to FIGS. 1 to 4 except for a first organic pattern 805 and a second organic pattern 905. Hereinafter, the first organic pattern 805 and the second organic pattern 905 will be described.

The second organic pattern 905 may be disposed in the second edge area 23 on the base substrate 100 of the display device 2000. In detail, the first organic pattern 805 may be disposed only in the central area 21 on the base substrate 100, and the second organic pattern 905 may contact the base substrate 100 in the second edge area 23. In other words, the inorganic pattern 200 may not be disposed in the second edge area 23 on the base substrate 100. Accordingly, a stress applied to the second edge area 23 of the display device 2000 may be reduced, and cracks may not be generated in the base substrate 100 in the second edge area 23. Accordingly, the display quality of the display device 1000 may be improved.

Meanwhile, the second edge area 23 is mainly described in FIGS. 4 and 5, but the first edge area 22 may also be substantially the same as the second edge area 23. Accordingly, a stress applied to the first edge area 22 may be reduced, and cracks may not be generated in the base substrate 100 in the first edge area 22.

FIGS. 6 to 12 are schematic cross-sectional views illustrating a method of manufacturing the display device of FIG. 1.

Figure 6:
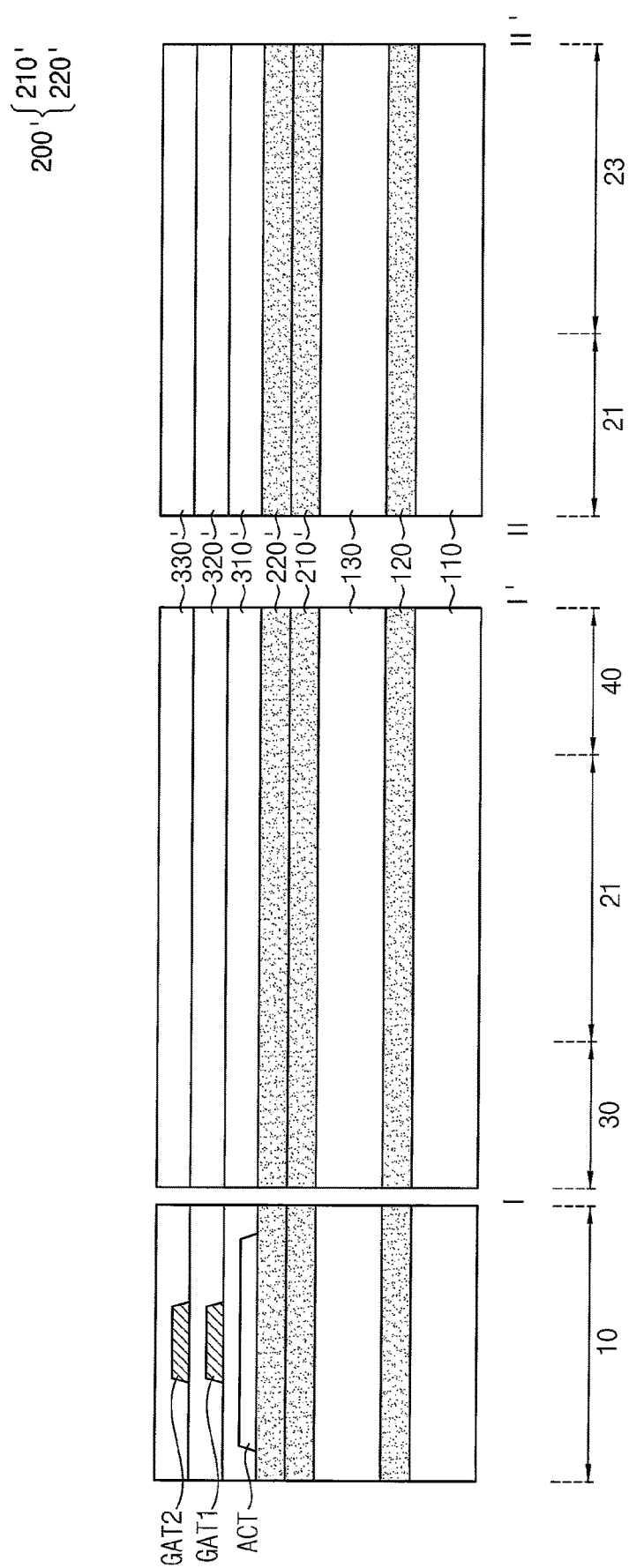
FIGS. 6 to 12 are schematic cross-sectional views illustrating a method of manufacturing the display device of FIG. 1.

Referring to FIGS. 1 and 6, to manufacture the display device 1000, the first plastic substrate 110, the first barrier layer 120, the second plastic substrate 130, and an inorganic pattern layer 200' may be provided. The inorganic pattern layer 200' may include a preliminary second barrier layer 210' and a preliminary buffer layer 220'. The active pattern ACT, the first gate electrode GAT1, and the second gate electrode GAT2 may be formed or disposed in the display area 10 on the preliminary buffer layer 220'. A preliminary first gate insulation layer 310', a preliminary second gate insulation layer 320', and a preliminary interlayer insulation layer 330' may be formed or disposed on the preliminary buffer layer 220' in the display area 10, the bending area 20, the first peripheral area 30, and the second peripheral area 40.

Figure 7:
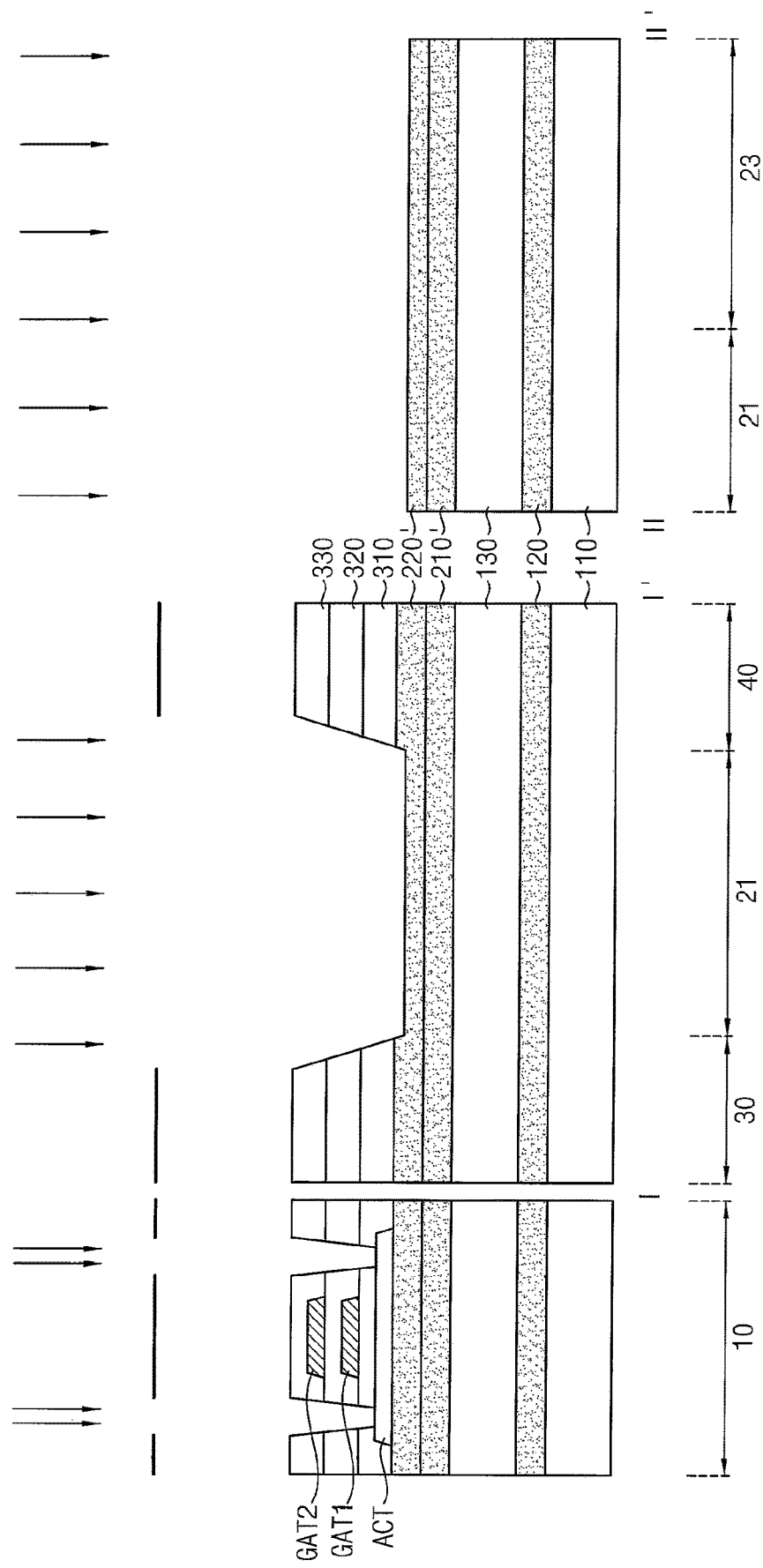

Referring to FIGS. 1 and 7, a first etching process for forming the first gate insulation layer 310, the second gate insulation layer 320, and the interlayer insulation layer 330 may be performed. For example, through the first etching process, a first contact hole exposing the source region of the active pattern ACT and a second contact hole exposing the drain region may be formed. For example, through the first etching process, an upper surface of the preliminary buffer layer 220' overlapping the central area 21 of the bending area 20 may be exposed. Meanwhile, a part of the preliminary buffer layer 220' overlapping the second edge area 23 of the bending area 20 may also be removed through the first etching process. For example, the first etching process may be performed using a mask including an opening corresponding to areas from which the components may be removed.

In an embodiment, the first etching process may be a dry etching process using a gas including fluorinated carbon and/or oxygen. In an embodiment, the first etching process may be a wet etching process using an etchant.

In a related art method of manufacturing a related art display device, a second etching process using a separate mask may be performed in order to remove a part of the preliminary second barrier layer 210' and the preliminary buffer layer 220'. For example, in order to remove the preliminary second barrier layer 210' and the preliminary buffer layer 220' overlapping the bending area 20, it may be necessary to perform the second etching process.

On the other hand, in the method of manufacturing the display device 1000 of the disclosure, the second etching process may not be performed. Accordingly, the number of masks required for the manufacturing process of the display device 1000 may be reduced and a process time may be shortened.

Figure 8:
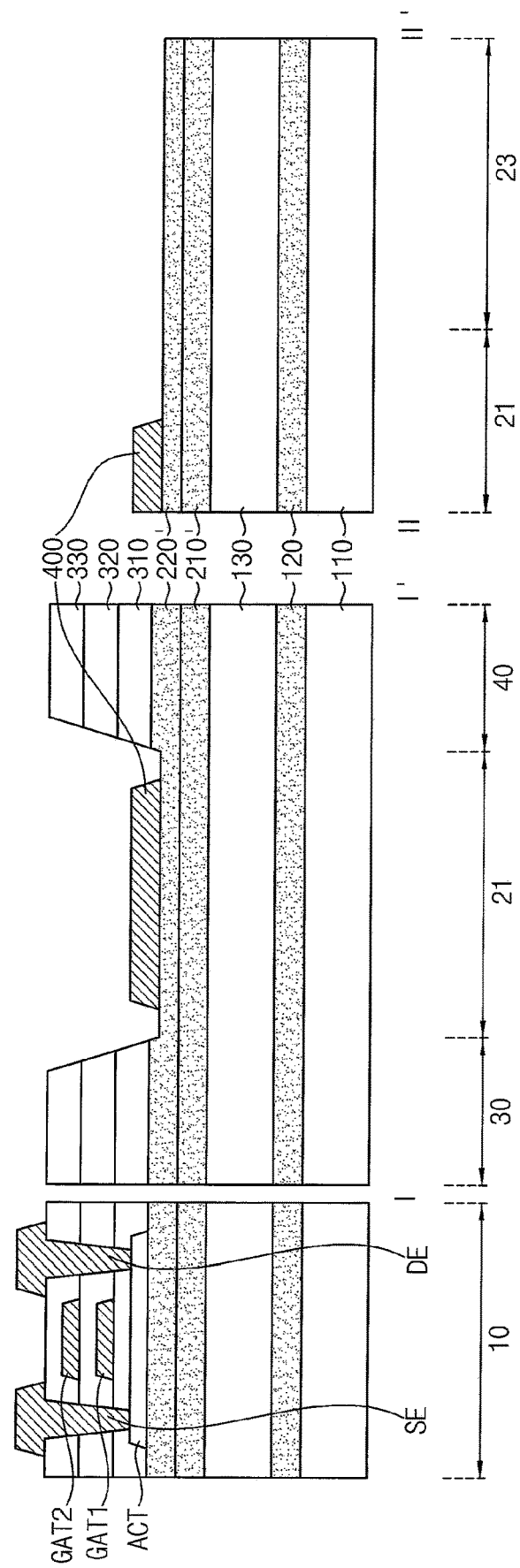

Referring to FIGS. 1 and 8, the source electrode SE and the drain electrode DE may be formed or disposed in the display area 10, and a dummy metal pattern 400 may be formed or disposed in the central area 21. The source electrode SE may be formed or disposed on the interlayer insulation layer 330 and may electrically contact the source area through the first contact hole. The drain electrode DE may be formed or disposed on the interlayer insulation layer 330 and may electrically contact the drain area through the second contact hole. The dummy metal pattern 400 may be formed or disposed on the preliminary buffer layer 220'. As described above, the dummy metal pattern 400 may prevent the diffusion of cracks generated in the second barrier layer 210 and the buffer layer 220 of the central area 21. Accordingly, the method of manufacturing the display device 1000 may not perform the second etching process. In other words, since the dummy metal pattern 400 is formed, the preliminary second barrier layer 210' and the preliminary buffer layer 220' overlapping the central area 21 may not be removed.

Figure 9:
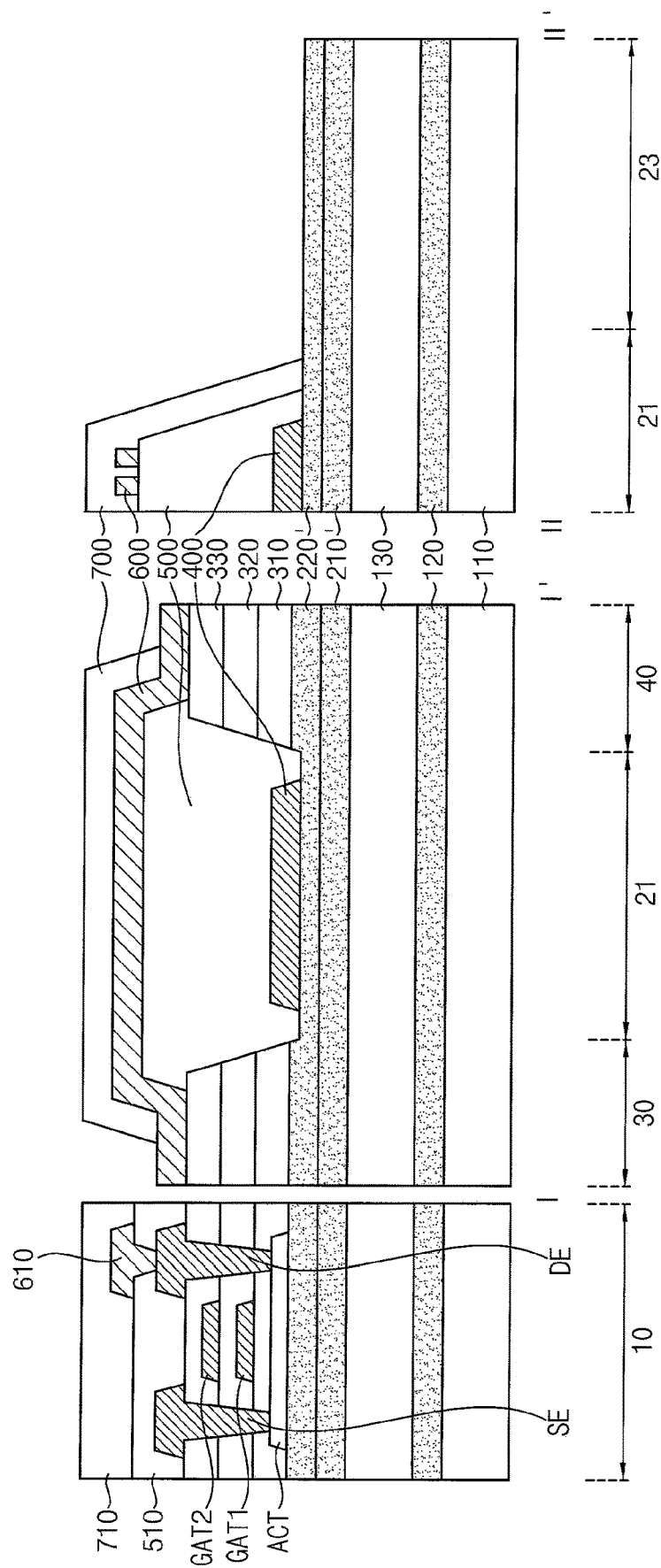

Referring to FIGS. 1 and 9, a first via pattern 510 may be formed in the display area 10, and a first insulation pattern 500 may be formed or disposed in the central area 21. The first via pattern 510 may be formed or disposed on the interlayer insulation layer 330 and may cover or overlap the source and drain electrodes SE and DE. The first insulation pattern 500 may be formed or disposed on the preliminary buffer layer 220' and may cover or overlap the dummy metal pattern 400. Meanwhile, the first insulation pattern 500 may not be formed or disposed on the second edge area 23.

A second metal pattern 610 may be formed or disposed in the display area 10, and the connection line 600 may be formed or disposed in the central area 21, the first peripheral area 30, and the second peripheral area 40. The second metal pattern 610 may be formed or disposed on the first via pattern 510. The connection line 600 may be formed or disposed on the first insulation pattern 500.

A second via pattern 710 may be formed in the display area 10, and the second insulation pattern 700 may be formed or disposed in the central area 21. The second via pattern 710 may be formed on the first via pattern 510 and may cover or overlap the second metal pattern 610. The second insulation pattern 700 may be formed or disposed on the first insulation pattern 500 and may cover or overlap the connection line 600. Meanwhile, the second insulation pattern 700 may not be formed or disposed on the second edge area 23.

Figure 10:
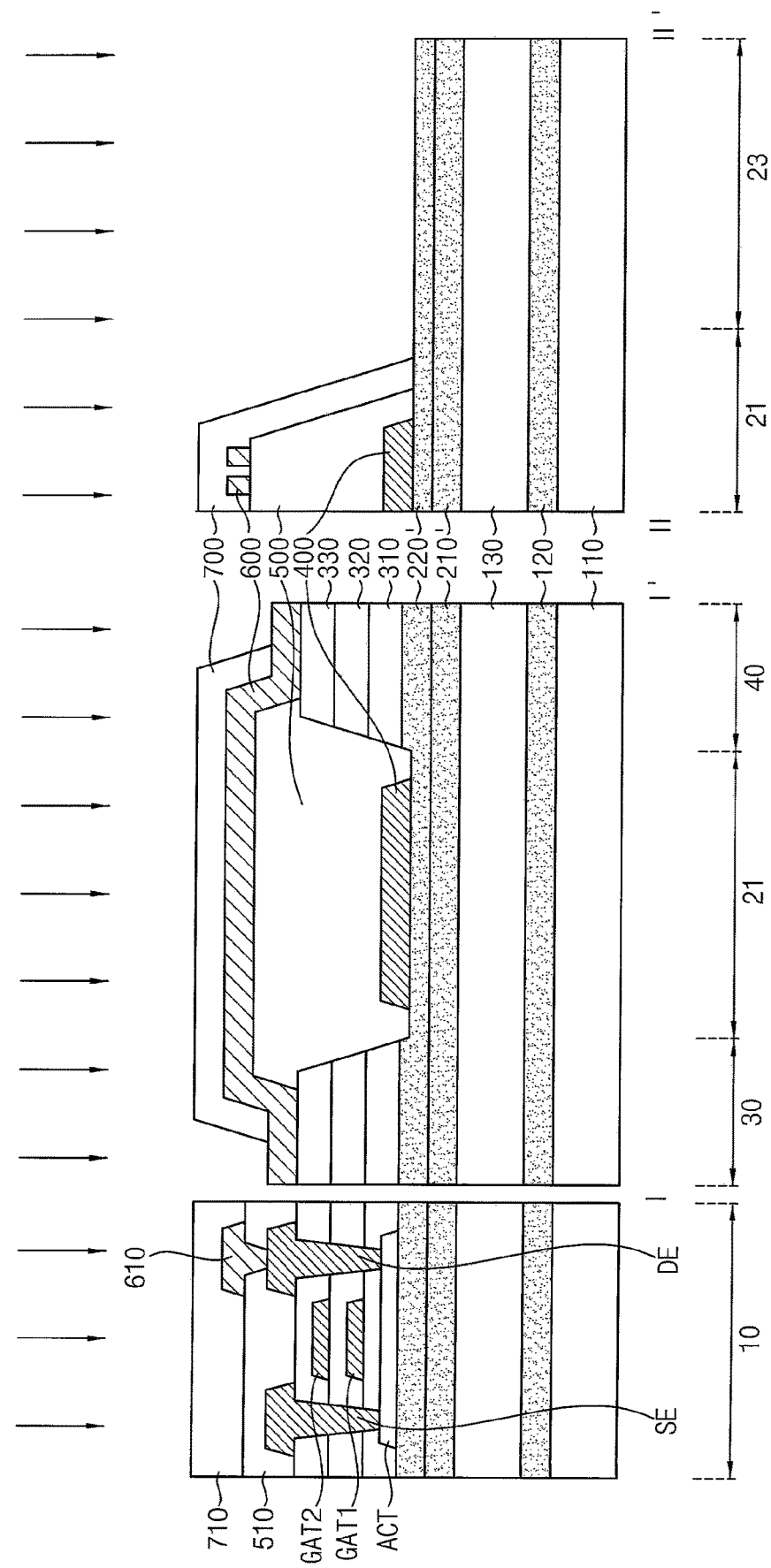
Figure 11:
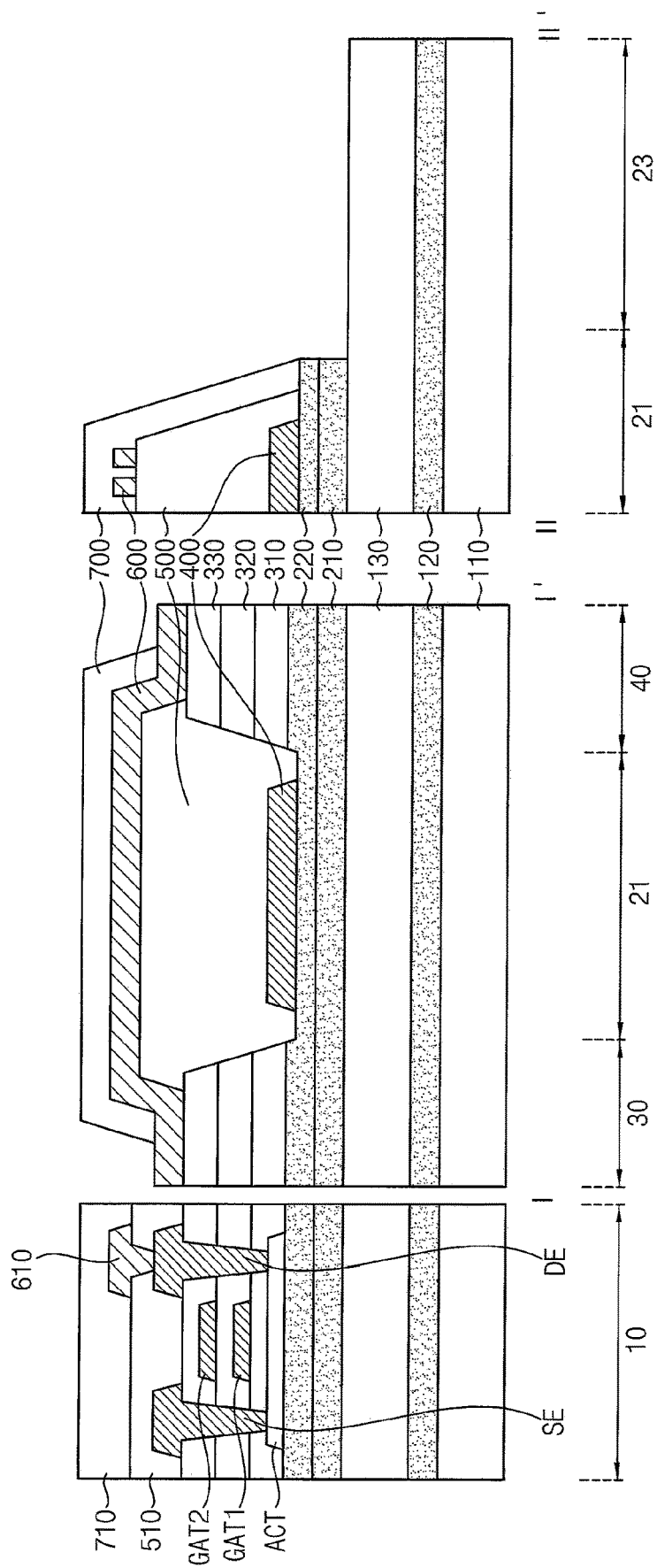

Referring to FIGS. 1, 10 and 11, a third etching process for forming the second barrier layer 210 and the buffer layer 220 may be performed. In an embodiment, the third etching process may be a dry etching process using a gas including fluorinated carbon and/or oxygen. In an embodiment, the third etching process may be a wet etching process using an etchant.

A part of the preliminary second barrier layer 210' and a part of the preliminary buffer layer 220' may be removed through the third etching process. For example, the preliminary second barrier layer 210' and the preliminary buffer layer 220' overlapping the second edge area 23 may be removed. Accordingly, an upper surface of the second plastic substrate 130 overlapping the second edge area 23 may be exposed. In an embodiment, the third etching process may be performed using the second via pattern 710 and the second insulation pattern 700 as mask. Accordingly, the number of masks required for the manufacturing method of the display device 1000 may be reduced. For example, since a part of the preliminary buffer layer 220' overlapping the second edge area 23 may be removed through the first etching process, a process time of the third etching process may be shortened. In other words, a part of the preliminary second barrier layer 210' and a part of the preliminary buffer layer 220' may be removed through the first and third etching processes.

Figure 12:
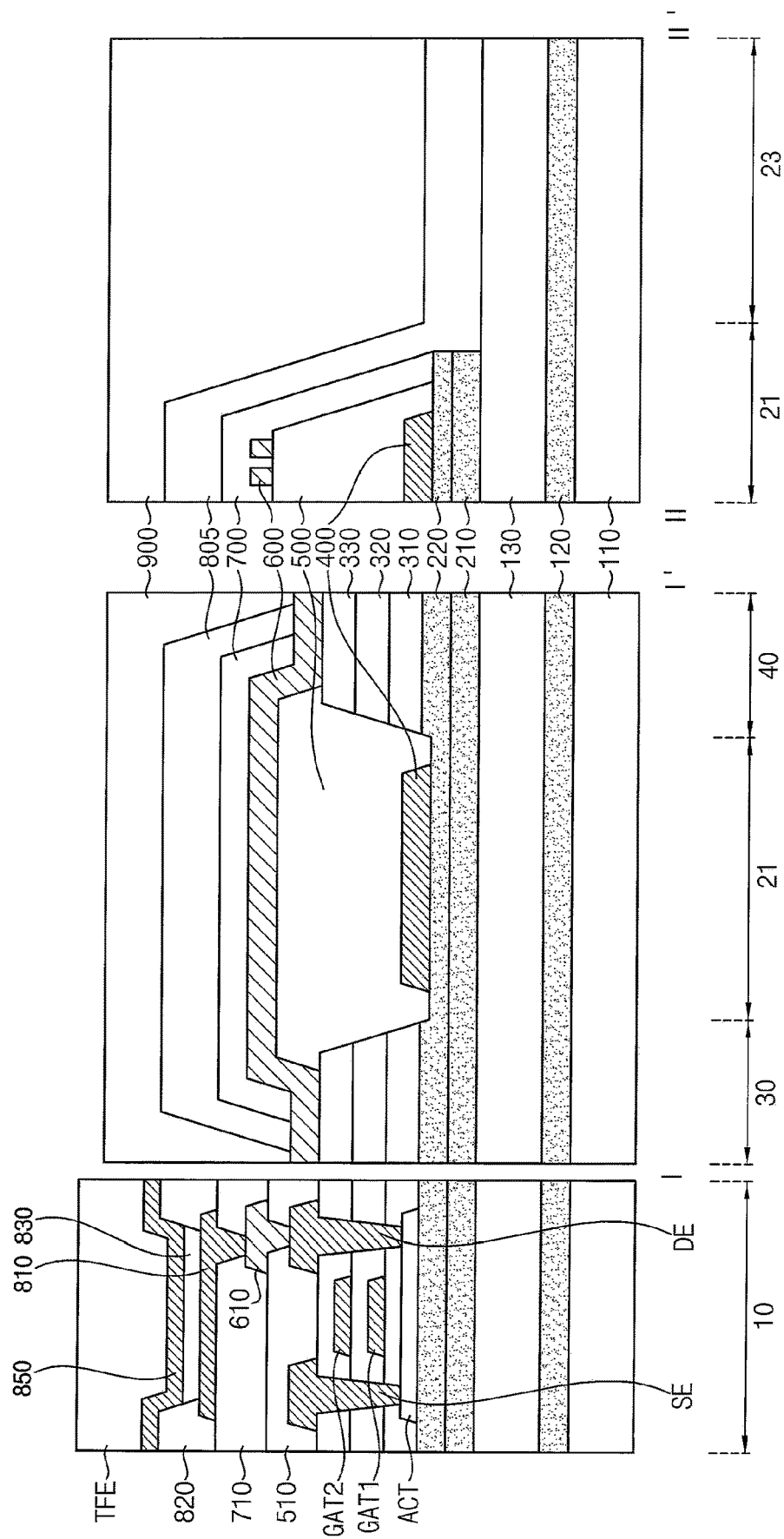

Referring to FIGS. 1 and 12, the first electrode 810 may be formed or disposed in the display area 10. The first electrode 810 may be formed or disposed in the display area 10 on the second via pattern 710 and may electrically contact the second metal pattern 610.

The pixel defining layer 820 may be formed or disposed in the display area 10, and the first organic pattern 800 may be formed or disposed in the bending area 20. The pixel defining layer 820 may be formed or disposed on the second via pattern 710 and may expose an upper surface of the first electrode 810. The first organic pattern 800 may cover or overlap the second insulation pattern 700 in the central area 21. For example, the first organic pattern 800 may contact the second plastic substrate 130 in the second edge area 23.

The emission layer 830, the second electrode 850, and the thin film encapsulation layer TFE may be formed or disposed in the display area 10, and the second organic pattern 900 may be formed or disposed in the bending area 20. The emission layer 830 may be formed or disposed on the exposed first electrode 810, and the second electrode 850 may be formed or disposed on the pixel defining layer 820 and the emission layer 830. The thin film encapsulation layer TFE may be formed or disposed on the second electrode 850. The second organic pattern 900 may be formed or disposed on the first organic pattern 800.

Figure 13:
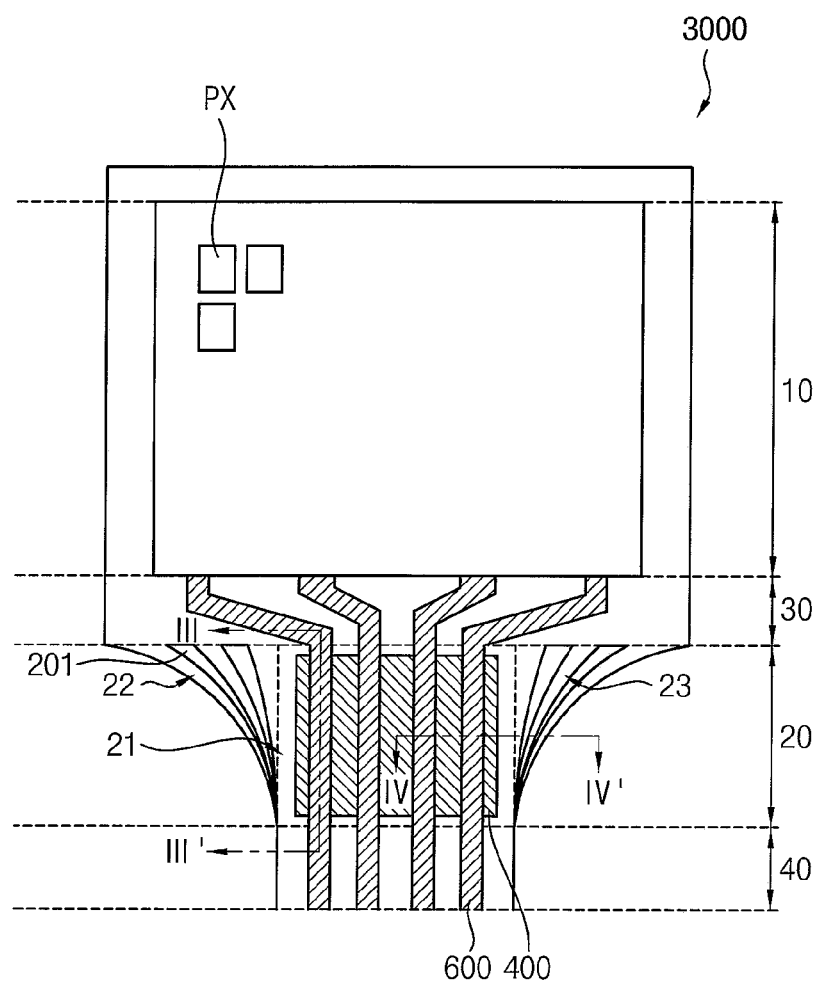
FIG. 13 is a plan view illustrating a display device according to an embodiment.
Figure 13:
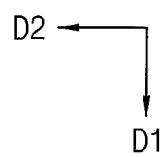
Figure 14:
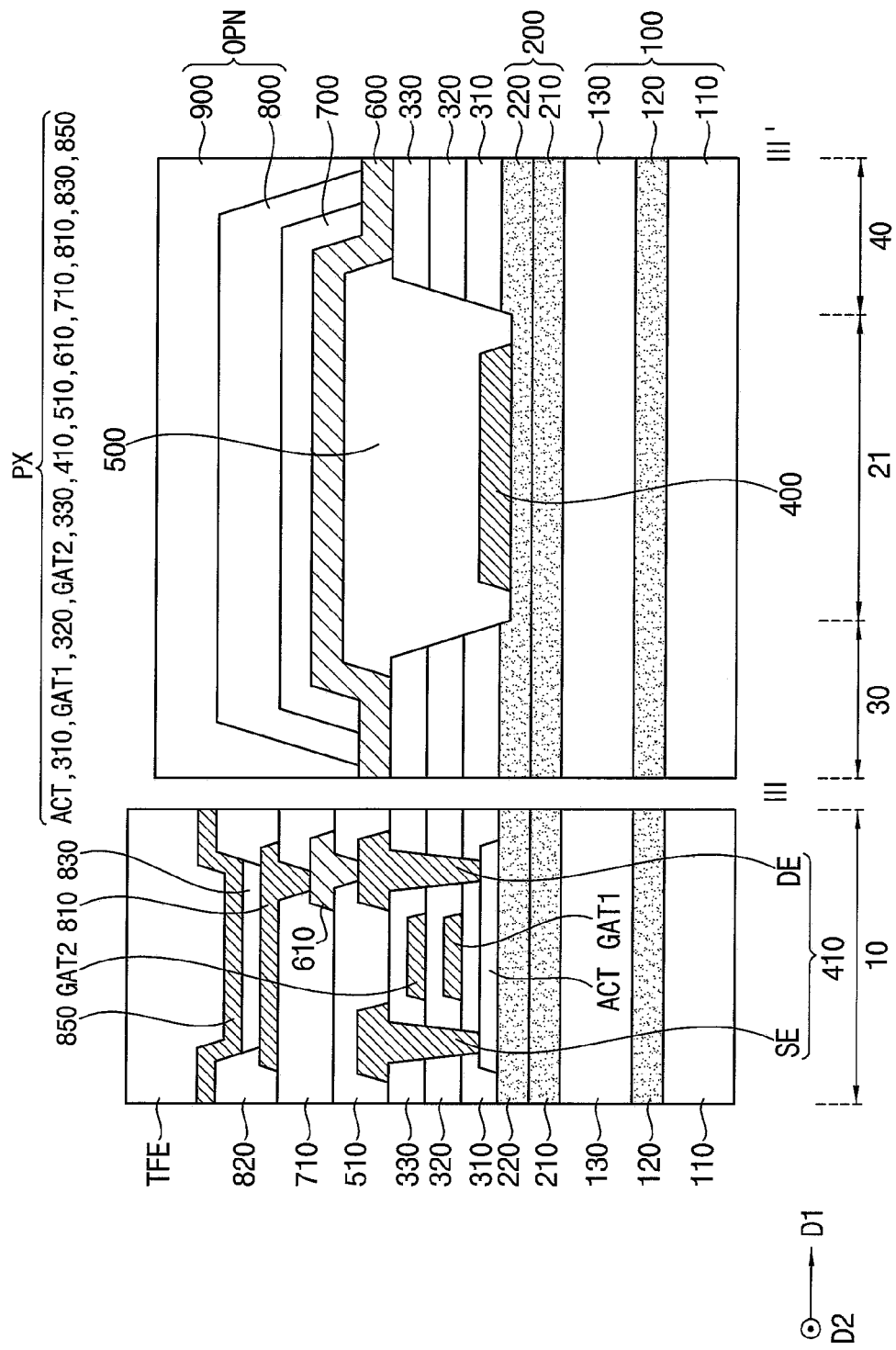
FIG. 14 is a schematic cross-sectional view corresponding to a display area, a central area, a first peripheral area, and a second peripheral area of the display device of FIG. 13.
Figure 15:
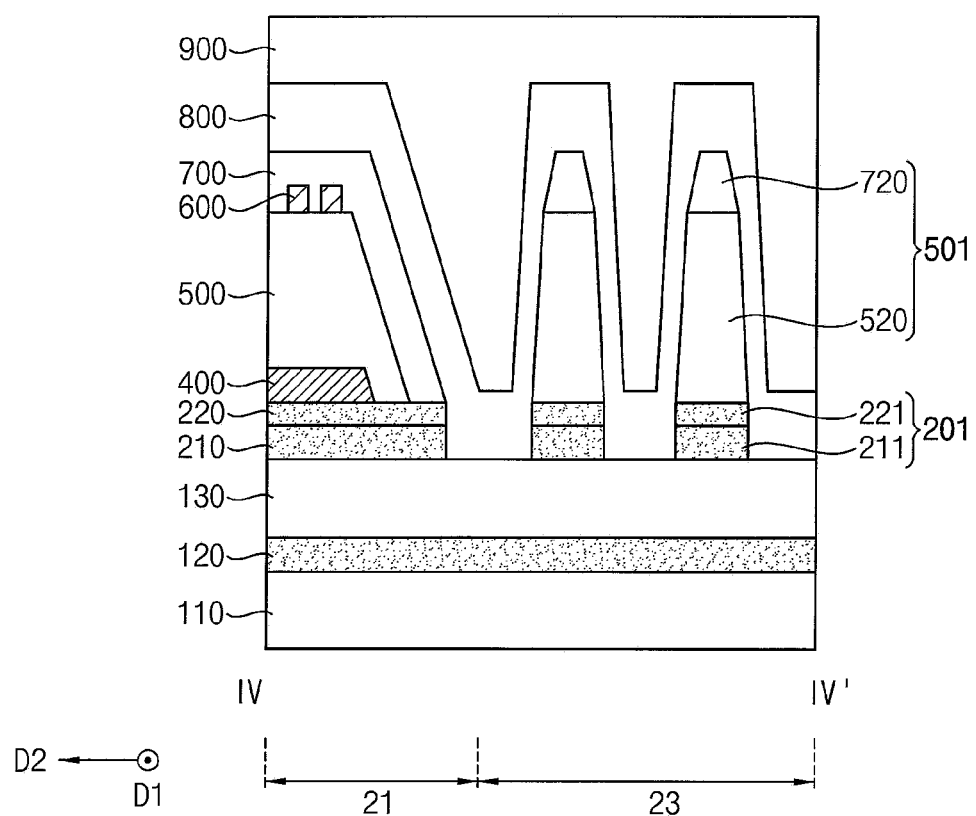
FIG. 15 is a schematic cross-sectional view corresponding to a central area and an edge area of the display device of FIG. 13.

FIG. 13 is a plan view illustrating a display device according to an embodiment. FIG. 14 is a schematic cross-sectional view corresponding to a display area, a central area, a first peripheral area, and a second peripheral area of the display device of FIG. 13. FIG. 15 is a schematic cross-sectional view corresponding to a central area and an edge area of the display device of FIG. 13. For example, FIG. 14 may be a schematic cross-sectional view taken line III-III' of FIG. 13, and FIG. 15 may be a schematic cross-sectional view taken line IV-IV' of FIG. 13.

Referring to FIG. 13, the display device 3000 may include a display area 10, a bending area 20, a first peripheral area 30, and a second peripheral area 40. The bending area 20 may include a central area 21, a first edge area 22 and a second edge area 23. The display area 10, the bending area 20, the first peripheral area 30, and the second peripheral area 40 of the display device 3000 may be substantially the same as the display area 10, the bending area 20, the first peripheral area 30, and the second peripheral area 40 of the display device 1000 described with reference to FIG. 1.

Referring to FIGS. 14 and 15, the display device 3000 may include a base substrate 100, an inorganic pattern 200, a pixel structure PX, a dummy metal pattern 400, a first insulation pattern 500, and a connection line 600, a second insulation pattern 700, an organic pattern OPN, a thin film encapsulation layer TFE, inorganic pieces or parts 201, and insulation pieces or parts 501.

The base substrate 100 may include a first plastic substrate 110, a first barrier layer 120, and a second plastic substrate 130. The inorganic pattern 200 may include a second barrier layer 210 and a buffer layer 220.

The pixel structure PX may include an active pattern ACT, a first gate insulation layer 310, a first gate electrode GAT1, a second gate insulation layer 320, a second gate electrode GAT2, and an interlayer insulation layer 330, a first metal pattern 410, a first via pattern 510, a second metal pattern 610, a second via pattern 710, a first electrode 810, an emission layer 830, and a second electrode 850.

The organic pattern OPN may include a first organic pattern 800 and a second organic pattern 900.

The inorganic pieces or parts 201, the insulation pieces or parts 501, the first organic pattern 800, and the second organic pattern 900 may be disposed in the second edge area 23 on the base substrate 100.

However, the display device 3000 may be substantially the same as the display device 1000 described with reference to FIGS. 3 and 4, except for the inorganic pieces or parts 201, the insulation pieces or parts 501, the first organic pattern 800, and the second organic pattern 900. Hereinafter, the inorganic pieces or parts 201, the insulation pieces or parts 501, the first organic pattern 800, and the second organic pattern 900 will be described.

The inorganic pieces or parts 201 may be disposed in the first edge area 22 and the second edge area 23 on the base substrate 100. For example, the inorganic pieces or parts 201 may extend from the second peripheral area 40 to the first peripheral area 30. For example, two or more inorganic pieces or parts 201 may be disposed, and the two or more inorganic pieces or parts 201 may be spaced apart from each other.

In an embodiment, as shown in FIG. 13, the inorganic pieces or parts 201 may extend from the second peripheral area 40 to the first peripheral area 30 in correspondence with a substantially planar shape of the first edge area 22. For example, the inorganic pieces or parts 201 may extend from the second peripheral area 40 to the first peripheral area 30 in correspondence with the substantially planar shape of the second edge area 23. For example, substantially planar shapes of the inorganic pieces or parts 201 may be curved or straight.

Each of the inorganic pieces or parts 201 may include a barrier inorganic piece or part 211 and a buffer inorganic piece or part 221.

The barrier inorganic piece or part 211 may be disposed in the first edge area 22 and the second edge area 23 on the base substrate 100. For example, the barrier inorganic piece or part 211 may include a same or similar material as the second barrier layer 210. In other words, the barrier inorganic piece or part 211 may be formed together with the second barrier layer 210.

The buffer inorganic piece or part 221 may be disposed on the barrier inorganic piece or part 211. The buffer inorganic piece or part 221 may overlap the barrier inorganic piece or part 211. For example, the buffer inorganic piece or part 221 may include a same or similar material as the buffer layer 211. In other words, the buffer inorganic piece or part 221 may be formed together with the buffer layer 211.

The insulation pieces or parts 501 may be disposed in the first edge area 22 and the second edge area 23 on the inorganic pieces or parts 201. In an embodiment, as shown in FIG. 13, the insulation pieces or parts 501 may overlap the inorganic pieces or parts 201. For example, the insulation pieces or parts 501 may extend from the second peripheral area 40 to the first peripheral area 30 in correspondence with a substantially planar shape of the first edge area 22. For example, the insulation pieces or parts 501 may extend from the second peripheral area 40 to the first peripheral area 30 in correspondence with a substantially planar shape of the second edge area 23. For example, a substantially planar shape of the insulation pieces or parts 501 may be curved or straight.

Each of the insulation pieces or parts 501 may include a first insulation piece or part 520 and a second insulation piece or part 720.

The first insulation piece or part 520 may be disposed on the buffer inorganic piece or part 221. In an embodiment, the first insulation piece or part 520 may overlap the buffer inorganic piece or part 221 and may completely cover or overlap an upper surface of the buffer inorganic piece or part 221. For example, the first insulation piece or part 520 may include a same or similar material as the first via pattern 510 and the first insulation pattern 500. In other words, the first insulation piece or part 520 may be formed together with the first via pattern 510 and the first insulation pattern 500.

The second insulation piece or part 720 may be disposed on the first insulation piece or part 520. In an embodiment, the second insulation piece or part 720 may overlap the buffer inorganic piece or part 221. For example, the second insulation piece or part 720 may include a same or similar material as the second via pattern 710 and the second insulation pattern 700. In other words, the second insulation piece or part 720 may be formed together with the second via pattern 710 and the second insulation pattern 700.

The first organic pattern 800 may be disposed in the bending area 20 on the base substrate 100. The first organic pattern 800 may cover or overlap the insulation pieces or parts 201 in the first edge area 22 and the second edge area 23. For example, the first organic pattern 800 may include a same or similar material as the pixel defining layer 820. In other words, the first organic pattern 800 may be formed together with the pixel defining layer 820.

The second organic pattern 900 may be disposed on the first organic pattern 800. For example, the second organic pattern 900 may be the above-described bending protection layer.

FIGS. 16 to 20 are schematic cross-sectional views illustrating a method of manufacturing the display device of FIG. 13.

Figure 16:
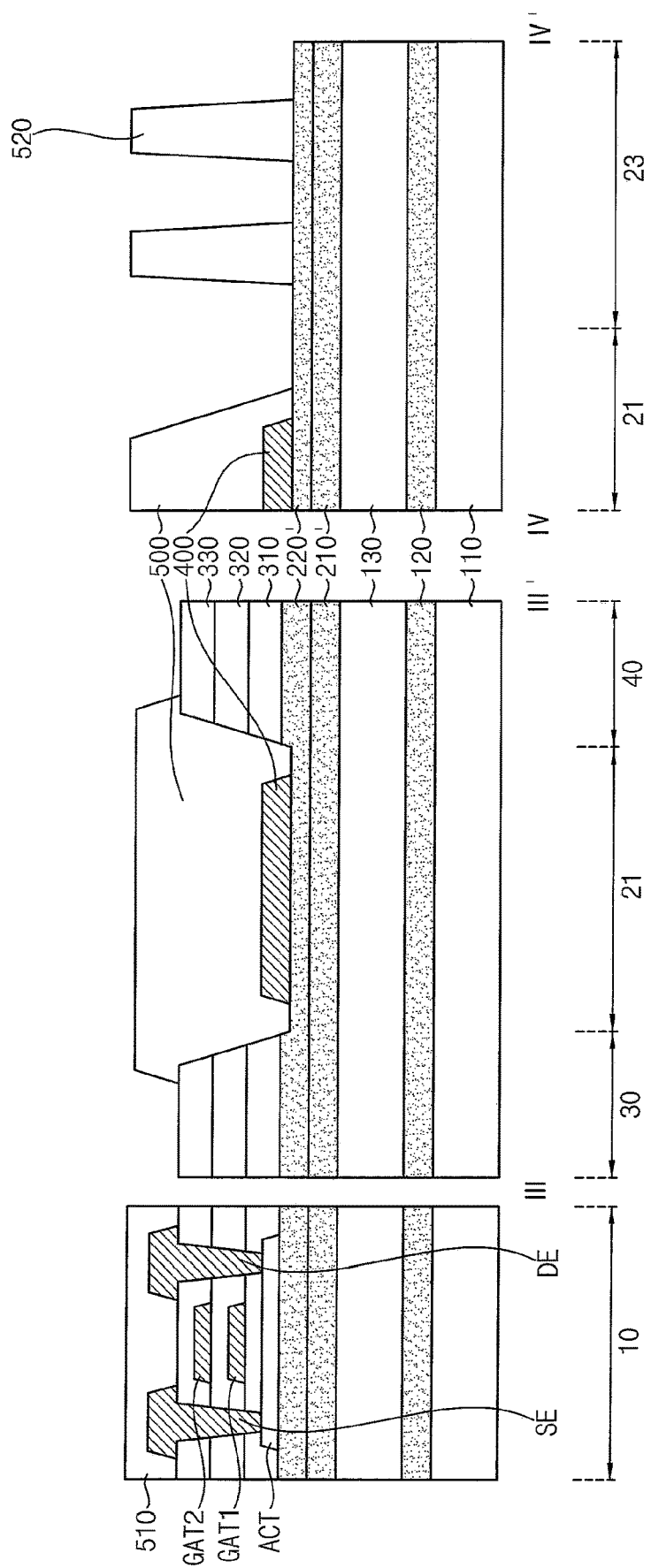
FIGS. 16 to 20 are schematic cross-sectional views illustrating a method of manufacturing the display device of FIG. 13.

Referring to FIGS. 13 and 16, to manufacture the display device 3000, the first plastic substrate 110, the first barrier layer 120, the second plastic substrate 130, the second preliminary barrier layer 210', and the preliminary buffer layer 220' may be provided. The active pattern ACT, the first gate electrode GAT1, and the second gate electrode GAT2 may be formed or disposed in the display area 10 on the preliminary buffer layer 220'. The first gate insulation layer 310, the second gate insulation layer 320, and the interlayer insulation layer 330 may be formed or disposed in the display area 10, the first peripheral area 30, and the second peripheral area 40 on the preliminary buffer layer 220' However, since the above-described description may be substantially the same as the manufacturing method of the display device 1000 described with reference to FIGS. 6 and 7, detailed descriptions will be omitted.

The source electrode SE and the drain electrode DE may be formed or disposed in the display area 10, and a dummy metal pattern 400 may be formed or disposed in the central area 21. The source electrode SE may be formed or disposed on the interlayer insulation layer 330 and may electrically contact the source area through the first contact hole. The drain electrode DE may be formed or disposed on the interlayer insulation layer 330 and may electrically contact the drain area through the second contact hole. The dummy metal pattern 400 may be formed or disposed on the preliminary buffer layer 220'. However, since the above-described description may be substantially the same as the manufacturing method of the display device 1000 described with reference to FIG. 8, detailed descriptions will be omitted.

The first via pattern 510 may be formed in the display area 10, a first insulation pattern 500 may be formed or disposed in the central area 21, and the first insulation piece or part 520 may be formed or disposed in the first and second edge areas 22 and 23. The first via pattern 510 may be formed or disposed on the interlayer insulation layer 330, and may cover or overlap the source and drain electrodes SE and DE. The first insulation pattern 500 may be formed or disposed on the preliminary buffer layer 220', and may cover or overlap the dummy metal pattern 400. The first insulation piece or part 520 may be formed or disposed on the preliminary buffer layer 220'. After forming a preliminary first via layer entirely in the display area 10, the bending area 20, the first peripheral area 30, and the second peripheral area 40, the first via pattern 510, the first insulation pattern 500, and the first insulation piece or part 520 may be formed by patterning the preliminary first via layer.

Figure 17:
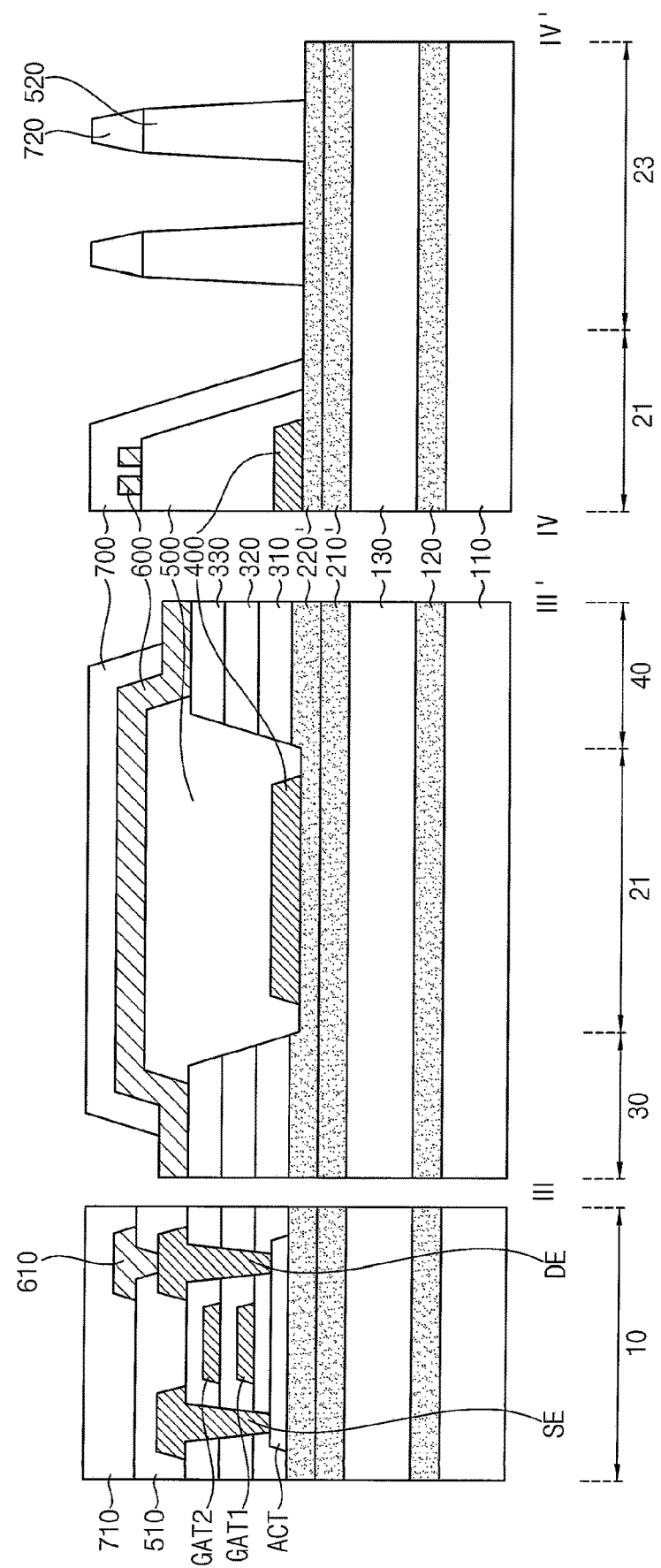

Referring to FIGS. 13 and 17, the second metal pattern 610 may be formed or disposed in the display area 10, and the connection line 600 may be formed or disposed in the central area 21, the first peripheral area 30, and the second peripheral area 40. The second metal pattern 610 may be formed or disposed on the first via pattern 510. The connection line 600 may be formed or disposed on the first insulation pattern 500.

The second via pattern 710 may be formed in the display area 10, a second insulation pattern 700 may be formed or disposed in the central area 21, and the second insulation piece or part 720 may be formed or disposed in the first and second edge areas 22 and 23. The second via pattern 710 may be formed on the first via pattern 510, and may cover or overlap the second metal pattern 610. The second insulation pattern 700 may be formed or disposed on the first insulation pattern 500, and may cover or overlap the connection line 600. The second insulation piece or part 720 may be formed or disposed on the first insulation piece or part 520. After forming a preliminary second via layer entirely in the display area 10, the bending area 20, the first peripheral area 30, and the second peripheral area 40, the second via pattern 710, the second insulation pattern 700, and the second insulation piece or part 720 may be formed by patterning the preliminary second via layer.

Figure 18:
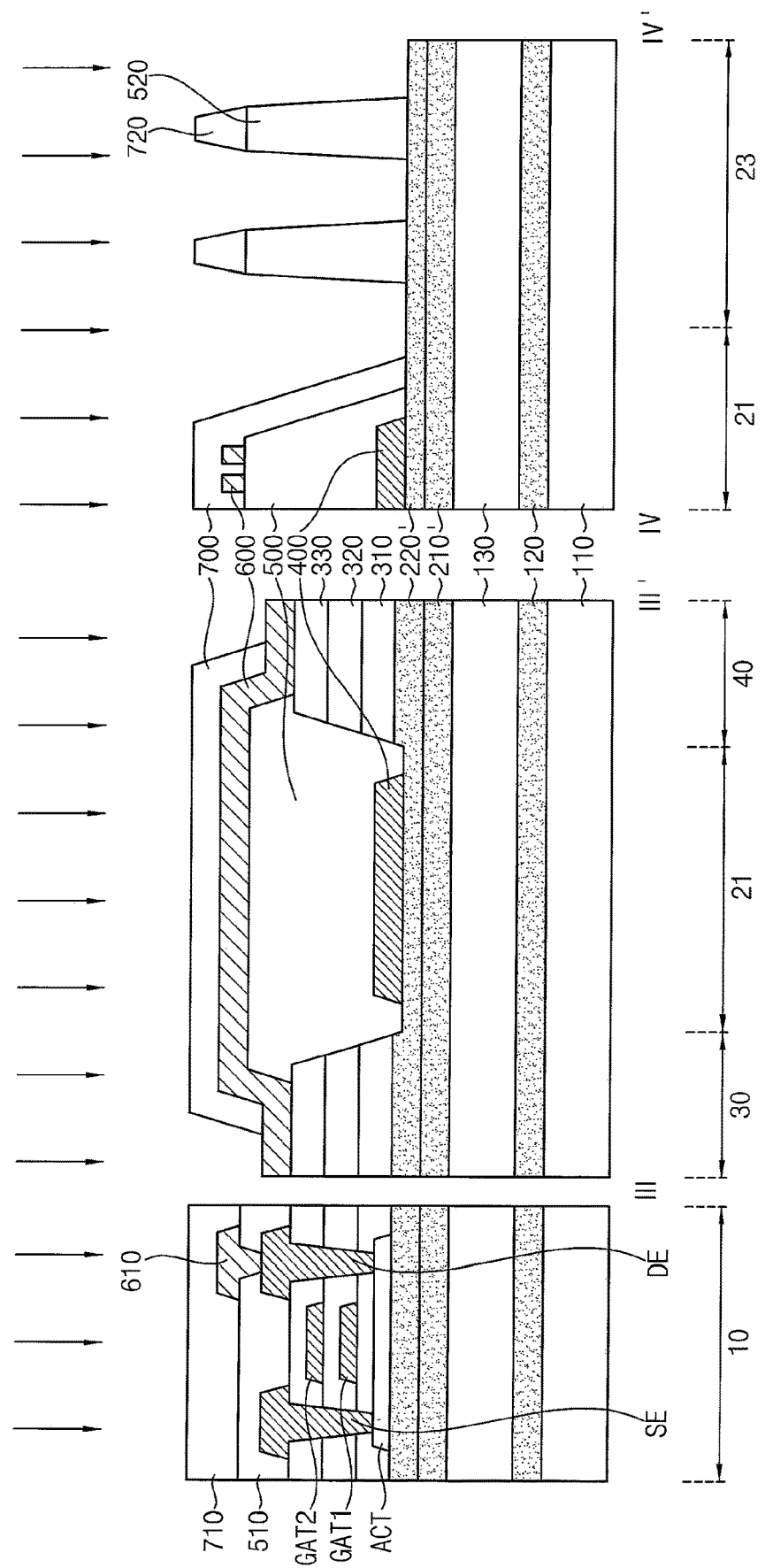
Figure 19:
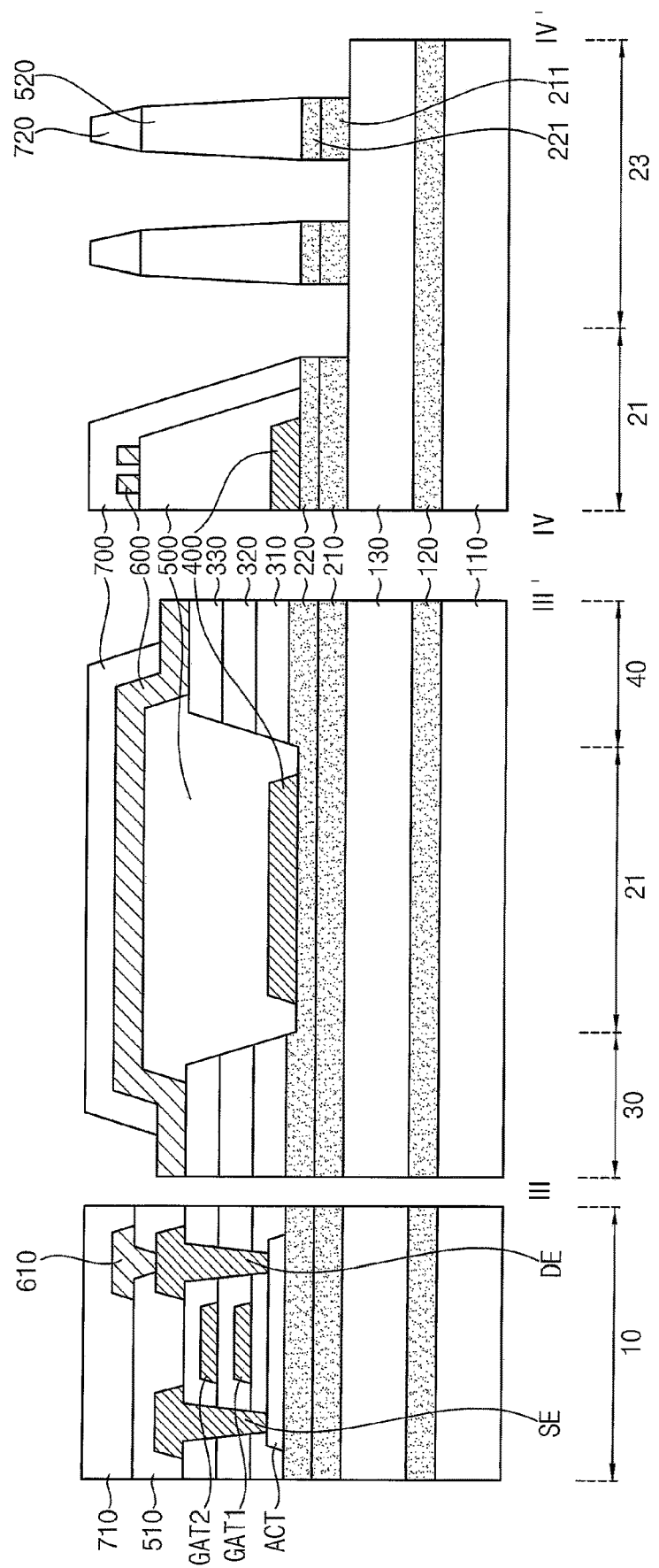

Referring to FIGS. 13, 18 and 19, an etching process for forming the second barrier layer 210 and the buffer layer 220 may be performed. In an embodiment, the etching process may be a dry etching process using a gas including fluorinated carbon and/or oxygen. In an embodiment, the etching process may be a wet etching process using an etchant.

A part of the preliminary second barrier layer 210' and a part of the preliminary buffer layer 220' may be removed through the etching process. For example, the preliminary second barrier layer 210' and the preliminary buffer layer 220' which may not overlap the first insulation pattern 500 and the first insulation piece or part 520 may be removed. In other words, the preliminary second barrier layer 210' and the preliminary buffer layer 220' which may not overlap the second via pattern 710, the second insulation pattern 700, and the second insulation piece or part 720 may be removed. In an embodiment, the etching process may be performed by using the second via pattern 710, the second insulation pattern 700, and the second insulation piece or part 720 as a mask. Accordingly, the number of masks required for the manufacturing process of the display device 3000 may be reduced.

Figure 20:
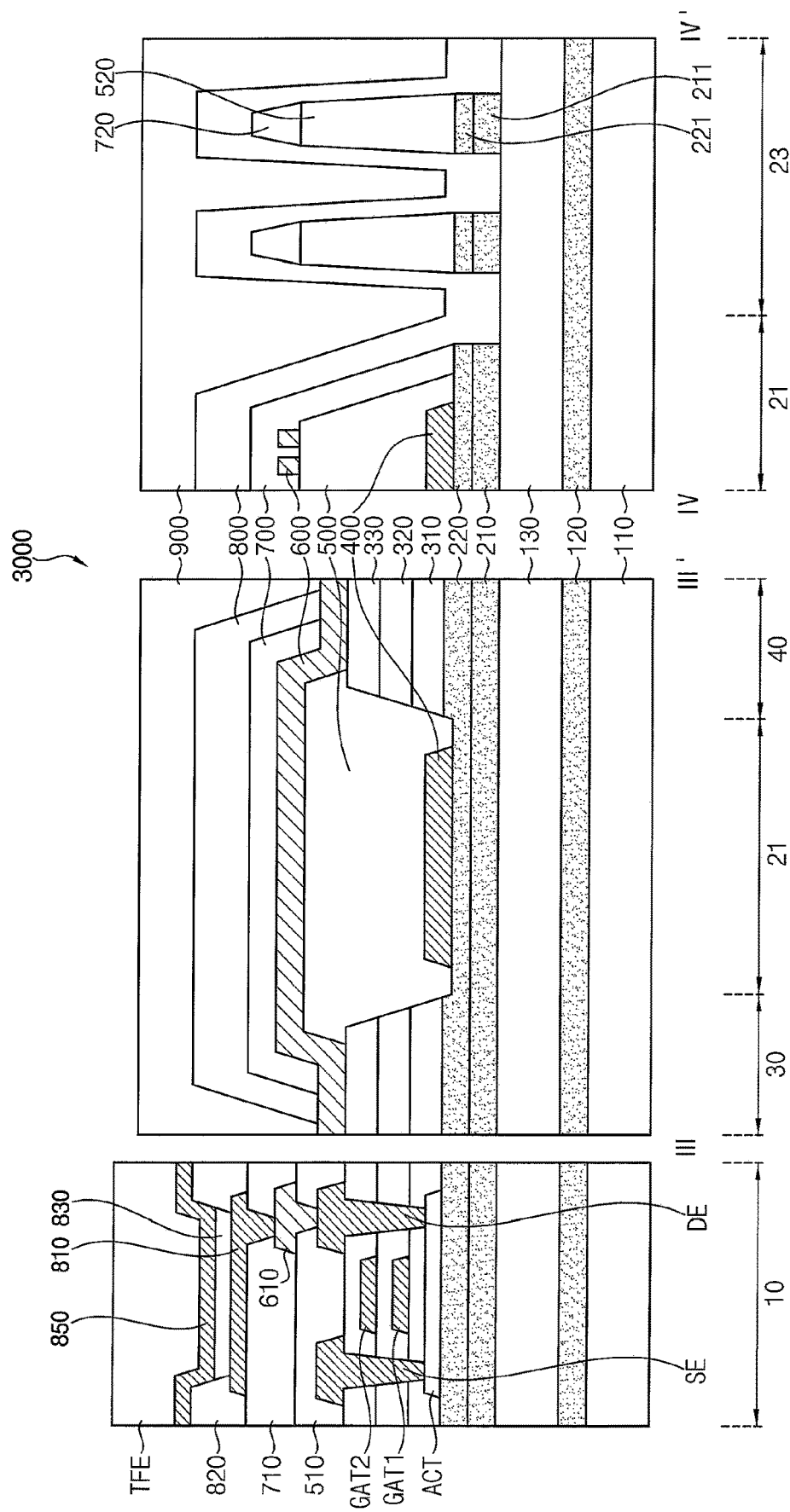

Referring to FIGS. 13 and 20, the first electrode 810 may be formed or disposed in the display area 10. The first electrode 810 may be formed or disposed in the display area 10 on the second via pattern 710 and may electrically contact the second metal pattern 610.

The pixel defining layer 820 may be formed or disposed in the display area 10, and the first organic pattern 800 may be formed or disposed in the bending area 20. The pixel defining layer 820 may be formed or disposed on the second via pattern 710 and may expose an upper surface of the first electrode 810. The first organic pattern 800 may cover or overlap the second insulation pattern 700 in the central area 21. For example, the first organic pattern 800 may contact the second plastic substrate 130 in the second edge area 23.

The emission layer 830, the second electrode 850, and the thin film encapsulation layer TFE may be formed or disposed in the display area 10, and the second organic pattern 900 may be formed or disposed in the bending area 20. The emission layer 830 may be formed or disposed on the exposed first electrode 810, and the second electrode 850 may be formed or disposed on the pixel defining layer 820 and the emission layer 830. The thin film encapsulation layer TFE may be formed or disposed on the second electrode 850. The second organic pattern 900 may be formed or disposed on the first organic pattern 800.

The display device according to an embodiment may include the first and second edge areas 22 and 23 in which the inorganic pattern 200 may not be disposed. Accordingly, the stress applied to the first and second edge areas 22 and 23 may be reduced, and the cracks may not be generated in the base substrate 100 in the first and second edge areas 22 and 23. Accordingly, the display quality of the display device may be improved. For example, the second via pattern 710 and the second insulation pattern 700 may be used as mask to form the inorganic pattern 200. Accordingly, the number of masks required for the manufacturing process of the display device may be reduced.

Although embodiments and implementations have been described herein, other embodiments and modifications will be apparent from this description. Accordingly, the embodiments are not limited to such embodiments, but rather to the broader scope of the appended claims and various modifications and equivalent arrangements as would be apparent to a person of ordinary skill in the art.

What is claimed is:

1. A display device comprising:
    a base substrate including:
        a display area; and
        a bending area bent from the display area,
        the bending area including:
            a central area; and
            an edge area positioned at a side of the central area;
    a pixel structure disposed in the display area on the base substrate;
    an inorganic pattern disposed in the central area on the base substrate; and
    an organic pattern disposed on the inorganic pattern, overlapping the inorganic pattern, and contacting the base substrate in the edge area.

2. The display device of claim 1, wherein the inorganic pattern is not disposed in the edge area of the base substrate.

3. The display device of claim 1, wherein the inorganic pattern includes:
    a barrier layer disposed on the base substrate; and
    a buffer layer disposed on the barrier layer.

4. The display device of claim 1, wherein the organic pattern and a pixel defining layer include a same material.

5. The display device of claim 1, wherein the organic pattern is a bending protection layer.

6. The display device of claim 1, further comprising:
    a dummy metal pattern of an island shape disposed on the inorganic pattern.

7. The display device of claim 6, further comprising:
    an insulation pattern overlapping the dummy metal pattern; and
    at least one connection line disposed on the insulation pattern and overlapping the dummy metal pattern.

8. The display device of claim 7, wherein the at least one connection line electrically connects the pixel structure to an external device.

9. The display device of claim 7, wherein the pixel structure includes:
    an active pattern disposed on the inorganic pattern;
    a gate insulation layer overlapping the active pattern;
    a gate electrode disposed on the gate insulation layer and overlapping the active pattern;
    an interlayer insulation layer overlapping the gate electrode;
    a first metal pattern disposed on the interlayer insulation layer and electrically connected to the active pattern;
    a first via pattern overlapping the first metal pattern;
    a second metal pattern disposed on the first via pattern and electrically connected to the first metal pattern;
    a second via pattern overlapping the second metal pattern;
    a first electrode disposed on the second via pattern and electrically connected to the second metal pattern;
    an emission layer disposed on the first electrode; and
    a second electrode disposed on the emission layer,
    wherein the at least one connection line and the second metal pattern include a same material.

10. The display device of claim 9, wherein the dummy metal pattern and the first metal pattern include a same material.

11. The display device of claim 9, wherein the insulation pattern and the first via pattern include a same material.

12. The display device of claim 1, wherein
    the base substrate includes:
        a first peripheral area positioned between the display area and the bending area and adjacent to a first side of the bending area; and
        a second peripheral area adjacent to a second side of the bending area, the second side of the bending area being opposite to the first side of the bending area, and
    the display device further includes a plurality of inorganic pieces that are disposed in the edge area on the base substrate and spaced apart from each other, and extend from the second peripheral area to the first peripheral area.

13. The display device of claim 12, further comprising:
    insulation pieces disposed on the plurality of inorganic pieces, respectively, and
    wherein the organic pattern overlaps the insulation pieces.

14. The display device of claim 13, wherein the pixel structure includes:
    an active pattern disposed on the inorganic pattern;
    a gate insulation layer overlapping the active pattern;
    a gate electrode disposed on the gate insulation layer and overlapping the active pattern;
    an interlayer insulation layer overlapping the gate electrode;
    a first metal pattern disposed on the interlayer insulation layer and electrically connected to the active pattern;
    a first via pattern overlapping the first metal pattern;
    a second metal pattern disposed on the first via pattern and electrically connected to the first metal pattern;
    a second via pattern overlapping the second metal pattern;
    a first electrode disposed on the second via pattern and electrically connected to the second metal pattern;
    an emission layer disposed on the first electrode; and
    a second electrode disposed on the emission layer,
    wherein each of the insulation pieces and the first via pattern includes a same material.

15. A method of manufacturing a display device, comprising:
    providing a base substrate including a display area and a bending area bent from the display area, the bending area including a central area and an edge area positioned at a side of the central area;
    forming an inorganic pattern layer on the base substrate;
    forming an insulation pattern on the inorganic pattern layer in the central area; and
    forming an inorganic pattern by removing the inorganic pattern layer overlapping the edge area through an etching process using the insulation pattern as a mask.

16. The method of claim 15, wherein the forming of the inorganic pattern includes forming the inorganic pattern to overlap the insulation pattern.

17. The method of claim 15, further comprising:
    forming an organic pattern on the base substrate after the forming of the inorganic pattern to contact the base substrate in the edge area.

18. The method of claim 15, further comprising:
    forming a dummy metal pattern of an island shape on the inorganic pattern layer in the central area.

19. The method of claim 18, further comprising:
forming a pixel structure in the display area on the base substrate, wherein the forming of the pixel structure includes:
  forming an active pattern on the inorganic pattern;
  forming a gate insulation layer overlapping the active pattern;
  forming a gate electrode on the gate insulation layer and overlapping the active pattern;
  forming an interlayer insulation layer overlapping the gate electrode;
  forming a first metal pattern on the interlayer insulation layer and electrically connected to the active pattern;
  forming a first via pattern overlapping the first metal pattern;
  forming a second metal pattern on the first via pattern and electrically connected to the first metal pattern;
  forming a second via pattern overlapping the second metal pattern;
  forming a first electrode on the second via pattern and electrically connected to the second metal pattern;
  forming an emission layer on the first electrode; and
  forming a second electrode on the emission layer, and
wherein the forming of the insulation pattern includes forming the insulation pattern together with the first via pattern.

20. The method of claim 19, wherein the forming of the dummy metal pattern includes forming the dummy metal pattern together with the first metal pattern.

* * * * *